United States Patent [19]
Du et al.

[11] Patent Number: 6,107,938
[45] Date of Patent: Aug. 22, 2000

[54] INFRARED PROXIMITY AND REMOTE CONTROL WALL SWITCH

[76] Inventors: Hong Feng Du, 329 Graham Ave., Apt. 2 Front, Brooklyn, N.Y. 11211; Jing Cheng Luo, 45 Rutgers St., Apt. 14G, New York, N.Y. 10002

[21] Appl. No.: 09/055,154

[22] Filed: Apr. 4, 1998

[51] Int. Cl.[7] .................................................. H04Q 19/00
[52] U.S. Cl. .............................. 340/825.72; 340/825.69; 307/117
[58] Field of Search ......................... 340/825.31, 825.69, 340/825.72, 825.34, 825.56; 473/199; 219/445.1; 250/370.15; 700/17; 307/117, 125

[56] References Cited

U.S. PATENT DOCUMENTS

| | | |
|---|---|---|
| 3,680,047 | 7/1972 | Perlman . |
| 4,305,006 | 12/1981 | Walthall et al. . |
| 4,306,147 | 12/1981 | Fukuyama et al. . |
| 4,684,822 | 8/1987 | Angott ................................ 340/825.72 |
| 4,935,733 | 6/1990 | Munekata ........................... 340/825.72 |
| 5,103,085 | 4/1992 | Zimmerman . |
| 5,508,691 | 4/1996 | Castleman .......................... 340/825.31 |
| 5,559,406 | 9/1996 | Chang . |
| 5,977,882 | 11/1999 | Moore ................................. 340/825.72 |

*Primary Examiner*—Howard L. Williams
*Assistant Examiner*—Jean B. Jeanglaude

[57] ABSTRACT

An infrared proximity and remote control wall switch positioned between a fixture and a voltage source for allowing a fixture to operate in one of a manual and automatic mode. The infrared proximity and remote control wall switch includes a three position switch operable between a first on position connecting the fixture directly to the voltage source, a second off position for disconnecting the fixture from the voltage source and a third auto position for allowing automatic operation of the fixture. An infrared emitter generates an infrared signal and an infrared receiver is connected to receive one of the infrared signal generated by the infrared emitter and reflected by an object and an infrared signal generated by a conventional television, video cassette recorder or hi-fi remote control unit. A device is connected to the infrared receiver for filtering the signal received by said infrared receiver and eliminate noise signals therefrom. Connected to the filtering device acts to connect the fixture to the voltage source upon receipt of a filtered signal from the filtering device. This device is able to eliminate noise signals from affecting the operation of the fixture when the switch is in the auto position and is able to activate the fixture to turn on at a plurality of different intensities. A timer may also be included for turning the fixture off after a predetermined period of time has passed since activation.

18 Claims, 20 Drawing Sheets

FIG 6

| FIG 6A |
| --- |
| FIG 6B |
| FIG 6C |

S2 — CONNECT SWITCH TO 120 VAC SOURCE LINE AND FIXTURE LINE (to replace a standard wall switch)

S4 — PLACE SWITCH IN OFF POSITION TO TURN FIXTURE OFF

S6 — PLACE SWITCH IN ON POSITION TO BYPASS REMOTE ACTIVATION CIRCUIT AND TURN FIXTURE ON

S8 — PLACE SWITCH IN AUTO POSITION TO ACTIVATE REMOTE ACTIVATION CIRCUIT

S10 — MOVE OBJECT IN FRONT OF INFRARED EMITTER TO REFLECT INFRARED SIGNAL BACK TO INFRARED RECEIVER THEN REMOVE OBJECT WITHIN ABOUT ONE SECOND, LIKE WAVING YOUR HAND ONCE, OR USE ANY TV, VCR, HI-FI REMOTE CONTROL TO TRANSMIT INFRARED BEAM TO INFRARED RECEIVER

S12 — FILTER AND AMPLIFY SIGNAL RECEIVED BY INFRARED RECEIVER

S14 — ACTIVATE CONTROL CIRCUIT TO PLACE TRIAC IN CONDUCTING STATE CONNECTING 120 VAC SOURCE TO TURN ON FIXTURE WITH INTENSITY LEVEL 1

FIG 6A

INFRARED PROXIMITY AND REMOTE CONTROL WALL SWITCH

BACKGROUND OF THE INVENTION

1. Field of the Invention

The present invention relates generally to electrical switches and, more specifically, to an infrared proximity and remote control wall switch which is automatically activated and deactivated based upon sensing of the proximity of an object thereto and can be remotely controlled using any conventional TV, VCR or other home entertainment infrared remote control unit.

2. Description of the Prior Art

Two types of infrared sensitive electrical light switches, i.e. passive switches and active switches, are presently known. Passive infrared detecting switches are commonly used for security purpose or for automatic lighting of driveways, hallways, and back yards. Passive infrared detecting switches detect an infrared signal emitted by a human body within a certain area and turn on a light for a predetermined period of time in response to detecting the signal emitted from the human body. Upon expiration of the predetermined period of time, a passive infrared detecting switch will automatically turn the light off. If a person remains in the area after the predetermined period of time, the passive infrared detecting switch will turn the light off and then turn it back on again. This can be very annoying to persons remaining in the area illuminated by the light.

The second type of infrared sensitive switch is an active infrared detecting switch. The active infrared detecting switch includes active infrared beam intersect switches, active infrared remote control switches and active infrared proximity switches. The active infrared beam intersect switch involves installation of an infrared beam generator on one side of an open space and an infrared beam reflector or receiver on the opposing side. When a person walks through this open space and intersects the infrared beam, the switch will turn on a light. The application of such a switch is limited due to the requirement of an open space. The active infrared remote control switch requires a special remote control designed for activating the switch to turn the light on and off. If the remote control is damaged or missing, the switch will not work at all or lose its remote control capability. In active infrared proximate switches, an infrared signal generator and an infrared receiver are mounted on an outwardly facing surface of the switch. When an object or a person's hand is moved close to or in front of the infrared signal generator, part of the infrared signal is reflected back to the infrared receiver and thus triggers the switch to turn the light on or off. Such switches lack the ability to be remotely controlled.

Numerous types of infrared sensitive electrical switches have been provided in the prior art. For example, U.S. Pat. Nos. 3,680,047; 4,305,006; 4,306,147; 5,103,085 and 5,559, 406 all are illustrative of such prior art. While these units may be suitable for the particular purpose to which they address, they would not be as suitable for the purposes of the present invention as heretofore described.

U.S. Pat. No. 3,680,047

Inventor: David E. Perlman

Issued: Jul. 25, 1972

A parametric integrator adapted for use in condition-responsive systems such as intruder detection devices. The integrator is normally inactive until a transient signal, uncharacteristic of a change in the condition being monitored, is received at the system input. The integrator is then rapidly switched into system circuitry for a predetermined time interval to reduce system sensitivity and thereby avoid the possibility of false alarming in response to the transient.

U.S. Pat. No. 4,305,006

Inventor: Michael S. Walthall et al.

Issued: Dec. 8, 1981

This patent discloses an active infrared proximity switch system. This system includes an on-off switch and a dimmer for an electrical load such as an electric light. The on-off switch comprises a source and detector of infra-red radiation for controlling on-off circuitry and a load switch. The on-off switch is activated by passing one's hand close to and in front of the source and detector. This action activates the on-off circuitry to control the load switch to turn the light on. A second pass of the hand turns the light off. A second source and detector of infra-red radiation and dimmer circuitry are provided for dimming purposes. Dimming action is achieved by placing one's hand close to and in front of the second source and detector to activate the dimmer circuitry to sequentially control the load switch to change the brightness level of the light. The dimming sequence is stopped when the desired brightness level is reached by moving the hand away from the second source and detector. Touching of the switch case is not required to activate the switch for on-off purposes or for dimming purposes.

In another embodiment of this device, two sources and a common detector are employed as part of two on-off switches for allowing independent control of two loads. In a further embodiment, two sources and a common detector are employed as part of an on off and dimmer switch for controlling a single load.

The invention described by this patent uses a Phase Lock Loop (PLL) circuit to generate a modulated infrared signal and to examine the received infrared signal. When an object is moved close to and in front of the infrared emitter, part of the modulated signal is reflected back to and received by the receiver which analyzes the received signal. If the received signal, or noise, has the exact same frequency of the emitted signal, an electrical signal will be generated to actuate an on-off circuitry to turn on or off a light. However, when the frequency of the received signal is different or slightly different from the frequency of the emitted signal, the on-off circuitry will not be actuated. In other words, this is an exact logic function system. This system also requires a direct connection to both an AC hot line and an AC common, i.e. neutral, line to power up the entire system. This wiring requirement makes it impossible to directly replace an existing mechanical electric wall switch with this one. Due to the AC line layout standard of industrial, commercial, and residential buildings, in which both the AC hot line and neutral line are laid up through ceilings, this system is as difficult to install as a new one. The AC neutral line is directly connected to one end of a light in the ceiling and the AC hot line is run down inside a wall to one end of a wall switch, continues on the other side of the wall switch and runs back up to the ceiling wherein it is connected to the other end of the light to thereby close the circuit loop. The AC neutral line does not normally pass by the wall switch. To install this switch, one must run an additional AC neutral line to the location where the switch will be installed. This takes a great deal of work, and is sometimes impossible. Furthermore, this system also lacks the ability to be remotely controlled and uses a separated infrared emitter and receiver set to control the light intensity.

U.S. Pat. No. 4,306,147

Inventor: Toshifumi Fukuyama et al.

Issued: Dec. 15, 1981

Reflection-type photoelectric switching apparatus comprising a housing having a transparent front window, a light projecting device, a light receiving device arranged in side-by-side relation with the light projecting device, the light projecting and receiving devices enclosed in the housing and in a predetermined space between the devices and the front window, an optically opaque screen having a pair of transparent portions corresponding to said light projecting and receiving devices, said screen being slidably disposed in said predetermined space, an adjusting mechanism controllable from outside of the housing for driving said screen to continuously adjust an effective area of said pair of transparent portions thereof, so that a detection field defined by a common zone, in which the projected and reflected light ray bundles are crossed, is continuously variable with said adjusting mechanism.

U.S. Pat. No. 5,103,085

Inventor: Thomas G. Zimmerman

Issued: Apr. 7, 1992

A reflection-type photoelectric proximity detector and switch is capable of detecting the intermental and binary proximity of a finger through several layers of glass, canceling out extraneous reflections and stray sources of radiation. The circuitry includes a modulated infrared emitter, an infrared detector, an optical barrier, an infrared filter, a bandpass filter, a signal rectifier, a biasing circuit to remove unwanted detected modulated signal, an amplifier, an incremental proximity output, a comparator, a detection reference, and a binary proximity detect output. In one embodiment a multitude of photoelectric proximity switches are installed on the inside of a store window, detect finger proximity from outside the window, and control electric appliances inside the window. From outside the window, a user can select what is displayed inside the window.

U.S. Pat. No. 5,559,406

Inventor: Chin-Hsiung Chang et al.

Issued: Sep. 24, 1996

A ceiling fan and light assembly control circuit including a microprocessor controlled by a single-throw switch and an infrared remote controller operated to regulate the fan speed and the intensity of light. A 60 Hz. Square wave signal of cycle 16.67 ms is obtained from the alternating current power supply and monitored by the microprocessor. When the square wave signal is interrupted by switching the single-throw switch on and off quickly, the microprocessor triggers a change in the operation mode of the ceiling fan and light assembly. The infrared remote controller can also be operated to control the fan speed and the light intensity when the single-throw switch is switched on.

SUMMARY OF THE PRESENT INVENTION

The present invention relates generally to electrical switches and, more specifically, to an infrared proximity and remote control wall switch which is automatically activated and deactivated based upon sensing of the proximity of an object thereto and can be remotely controlled using any conventional TIV, VCR or other home entertainment infrared remote control unit.

In developing electronic devices noise is a major consideration. Many infrared sensitive devices on the market do not work properly, encountering problems such as mistaken action or self-trigger, due to improperly handling noise. In developing an infrared sensitive switch, one must deal with basic noise sources such as:

1) Continuous electrical ripple noise from AC utility lines having line frequencies of 50–60Hz reducing the sensitivity of a device, and especially interfering with the normal function of a small signal circuit. This is a very common ripple noise existing in electronic circuits and is directly coupled from the AC power line.
2) High frequency momentary electrical noise, i.e. spikes, from AC utility lines caused by switching appliances or lights on and off. This high frequency noise has relatively high amplitudes, but normally lasts for only few pulses or spikes before disappearing.
3) High frequency momentary light noise caused by a sudden change of light intensity in the environment, such as switching a light on or off. An infrared sensor picks up the light noise, converts it into electrical noise, and passes it to the electronic circuit. This high frequency noise also normally lasts for only few pulses or spikes before disappearing; and
4) High frequency radiation noise.

It is thus a primary object of the present invention to provide an infrared proximity and remote control wall switch that will overcome the shortcomings of prior art devices.

Another object of the present invention is to provide an infrared proximity and remote control wall switch which is able to distinguish between short distance (under 1.5 ft.) proximate non-touching control and long distance (up to 25 ft. away) remote control without any intervention while also solving the problem of noise interference from AC line frequency and momentary high frequency noise from other appliances thus providing high sensitivity to control signals and high immunity to noise.

An additional object of the present invention is to provide an infrared proximity and remote control wall switch which is able to be used in public places, such as rest rooms, hospitals, or food processing units, to prevent germs transfer.

A further object of the present invention is to provide an infrared proximity and remote control wall switch which is able to provide a great convenience due to the hands off and remote control activation.

A yet further object of the present invention is to provide an infrared proximity and remote control wall switch which is able to be operated at either close range or from a large distance without touching the switch itself.

A further object of the present invention is to provide an infrared proximity and remote control wall switch that is capable of activating the fixture to either turn on or off at close range by waving an object in front of the switch.

A still further object of the present invention is to provide an infrared proximity and remote control wall switch that may be activated to turn the fixture on or off at far range by pressing any button on a conventional remote control of TV, VCR, or other home entertainment unit at up to twenty five feet from the switch when the remote control is pointed directly at the switch.

An even further object of the present invention is to provide an infrared proximity and remote control wall switch that may be activated to turn the fixture on at different intensity levels.

A yet further object of the present invention is to provide an infrared proximity and remote control wall switch including one infrared emitter and infrared receiver pair to control the turning on, turning off and controlling the intensity level of the fixture.

Another object of the present invention is to provide an infrared proximity and remote control wall switch that is easily installed to replace a conventional electrical switch.

A still further object of the present invention is to provide an infrared proximity and remote control wall switch that is able to associate particular buttons on a conventional remote control with particular functions for controlling the switch such as turning the fixture on, turning the fixture off or controlling the intensity at which the fixture is illuminated.

An even further object of the present invention is to provide an infrared proximity and remote control wall switch that uses encoded infrared emitting signals for controlling the allowable proximity of an object for activating the switch and further improve noise immunity of the switch.

A yet further object of the present invention is to provide an infrared proximity and remote control wall switch including a timer control which can be set to automatically turn on or off the fixture at a desired time or after a desired interval when the switch is in the auto mode.

Another object of the present invention is to provide an infrared proximity and remote control wall switch that is simple and easy to use.

A still further object of the present invention is to provide an infrared proximity and remote control wall switch infrared proximity and remote control wall switch that is economical in cost to manufacture.

Additional objects of the present invention will appear as the description proceeds.

An infrared proximity and remote control wall switch positioned between a fixture and a voltage source for allowing a fixture to operate in one of a manual and automatic mode. The infrared proximity and remote control wall switch includes a three position switch operable between a first on position connecting the fixture directly to the voltage source, a second off position for disconnecting the fixture from the voltage source and a third auto position for allowing automatic operation of the fixture. An infrared emitter generates an infrared signal and an infrared receiver is connected to receive one of the infrared signal generated by the infrared emitter and reflected by an object and an infrared signal generated by a remote control unit. A device is connected to the infrared receiver for filtering the signal received by said infrared receiver and eliminate noise signals therefrom. Connected to the filtering device acts to connect the fixture to the voltage source upon receipt of a filtered signal from the filtering device. This device is able to eliminate noise signals from affecting the operation of the fixture when the switch is in the auto position and is able to activate the fixture to turn on at a plurality of different intensities. A timer may also be included for turning the fixture off or on after a predetermined period of time has passed since activation. The infrared proximity and remote control wall switch also possesses the ability to learn and memorize particular control signals for controlling its operation. The button desired to control the turning on and off of the infrared proximity and remote control wall switch 10 is simply pressed and held while pointing the remote control at the infrared proximity and remote control wall switch 10. The number of times the fixture 32 changes its state from on to off is counted and the button is released when the count reaches five (or more, depending on the set up of micro-controller U9). The infrared proximity and remote control wall switch 10 has now learned and memorized, to accept only a signal generated in response to pressing of that button to perform the desired feature. In order to erase the memory of the programmed button and return to normal operation, the programmed button is pressed and held while pointing the remote control at the infrared proximity and remote control wall switch 10. The number of times the fixture 32 changes state from on to off is counted and the button is released when the count reaches ten (or above ten, depending upon the set up of micro-controller U9).

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWING FIGURES

Various other objects, features and attendant advantages of the present invention will become more fully appreciated as the same becomes better understood when considered in conjunction with the accompanying drawings, in which like reference characters designate the same or similar parts throughout the several views.

FIG. 6A–6C are flow chart illustrating the operating process of the infrared proximity and remote control wall switch of the present invention;

Figure 10A:
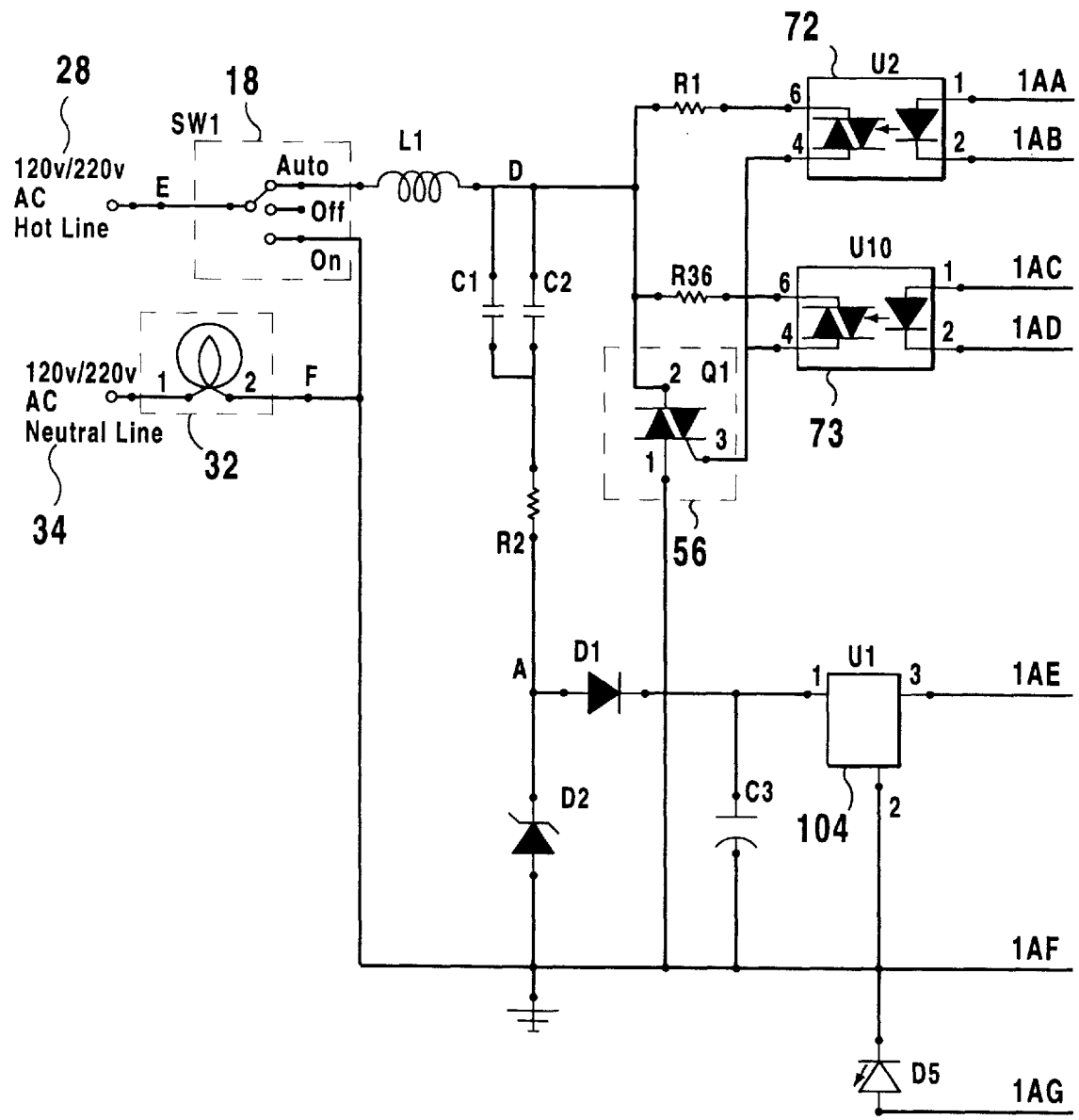
Figure 10B:
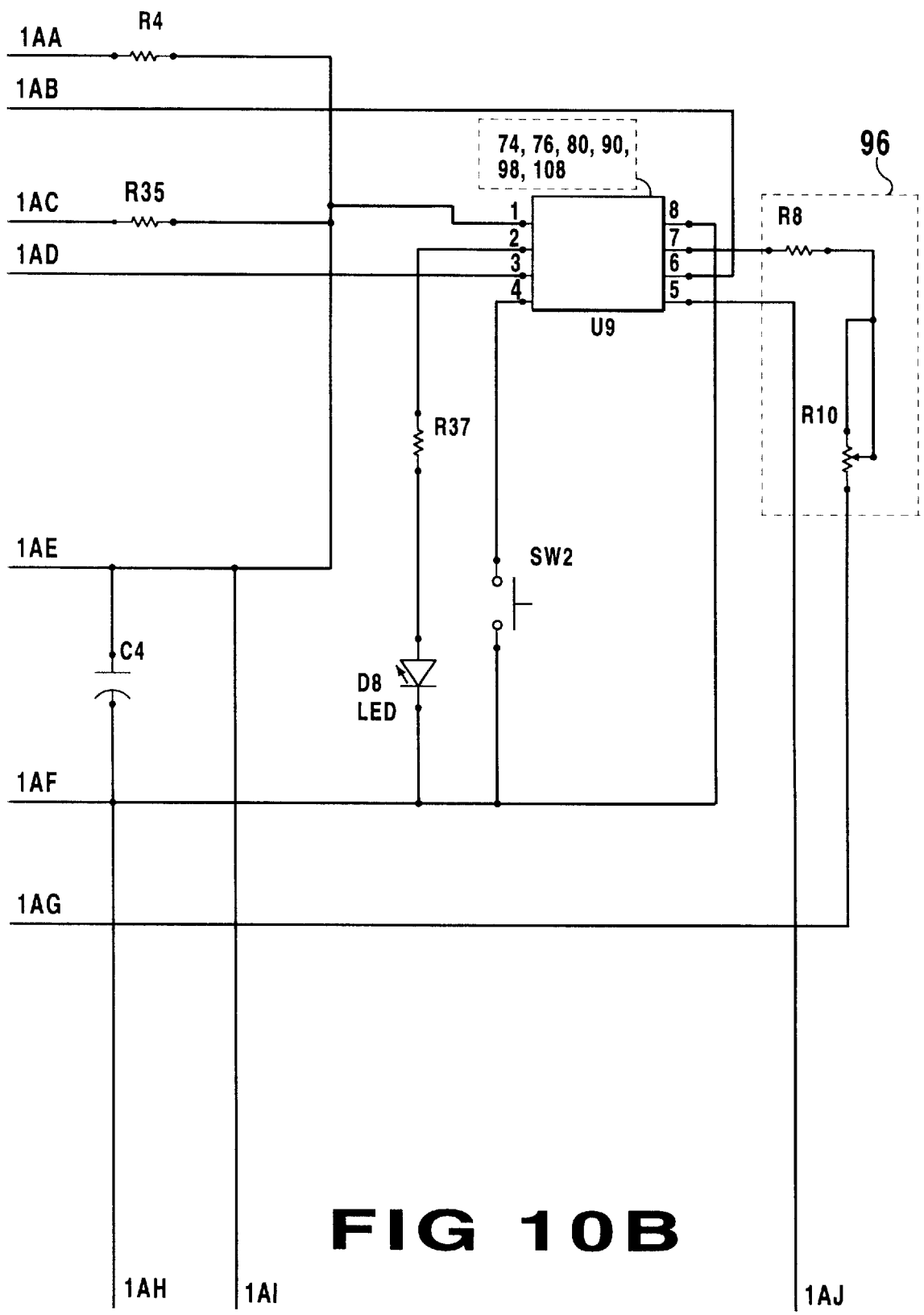
Figure 10C:
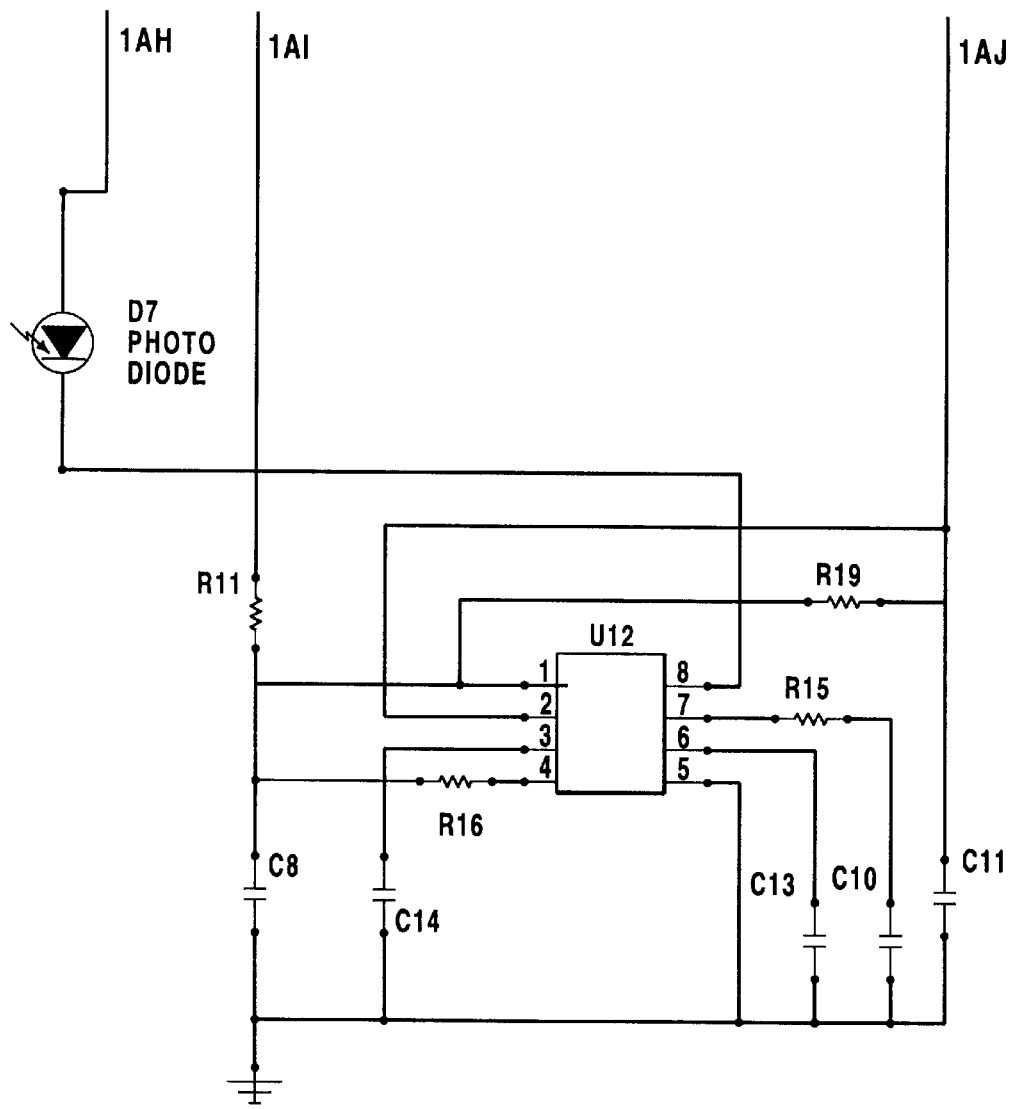

FIGS. 7A–D illustrate a schematic diagram of the infrared proximity and remote control wall switch of the present invention;

FIGS. 8A–8G are timing diagrams of the counters of the infrared proximity and remote control wall switch of the present invention;

FIGS. 9A–9D illustrate a schematic diagram of a micro-controller implementation of the infrared proximity and remote control wall switch shown in FIG. 7; and FIGS. 10A–C illustrate a schematic diagram of an alternate embodiment of the micro-controller of the infrared proximity and remote control wall switch of the present invention.

DESCRIPTION OF THE REFERENCED NUMERALS

Turning now descriptively to the drawings, in which similar reference characters denote similar elements throughout the several views, the Figures illustrate the infrared proximity and remote control wall switch of the present invention. With regard to the reference numerals used, the following numbering is used throughout the various drawing figures.

- 10 infrared proximity and remote control wall switch of the present invention
- 12 face plate
- 14 top screw
- 16 bottom screw
- 18 three position switch
- 19 on position of the three position switch
- 20 off position of the three position switch
- 21 auto position of the three position switch
- 24 wall
- 26 electrical switch box containing infrared proximity and remote control wall switch of the present invention
- 28 120 VAC source lead line
- 30 connection from infrared proximity and remote control wall switch of the present invention to the fixture
- 32 fixture
- 34 neutral lead line
- 35 mounting box of wall switch
- 36 bottom terminal of three way strobe switch
- 38 middle terminal of three way strobe switch
- 42 top terminal of three way strobe switch
- 44 lines connecting infrared emitter and receiver to circuitry
- 46 ON position of switch
- 48 OFF position of switch
- 50 AUTO position of switch
- 52 lead line from ON position of switch
- 54 lead line from AUTO position of switch
- 56 triac switch
- 58 processing circuitry of infrared proximity and remote control wall switch of the present invention including an analog and digital section
- 59 analog section of processing circuitry
- 60 infrared light filter
- 61 digital section of processing circuitry
- 62 transmitted infrared beam
- 64 object in path of transmitted infrared beam
- 66 reflected infrared beam
- 68 remote control unit used with any conventional television, video cassette recorder, stereo, etc.
- 70 transmitted infrared beam from remote control
- 72 first ON/OFF control for triac
- 73 second ON/OFF control for triac
- 74 counter
- 76 monostable multivibrator
- 78 resetting square wave generator
- 80 counter
- 82 signal processor
- 84 amplifier
- 86 filter for infrared receiver
- 88 infrared receiver mounted behind infrared light filter
- 90 oscillator for infrared emitter
- 92 infrared emitter mounted behind infrared light filter
- 94 power supply
- 96 current limiting resistor
- 98 signal shaping circuit
- 100 voltage divider
- 102 Schmitt trigger
- 104 DC voltage regulator
- 106 Operational amplifier
- 108 signal inverter

DETAILED DESCRIPTION OF THE PREFERRED EMBODIMENT

Turning now descriptively to the drawings, in which similar reference characters denote similar elements throughout the several views, FIGS. 1–10 illustrate the infrared proximity and remote control wall switch of the present invention. The infrared proximity and remote control wall switch of the present invention is indicated generally by the numeral 10.

Figure 1:
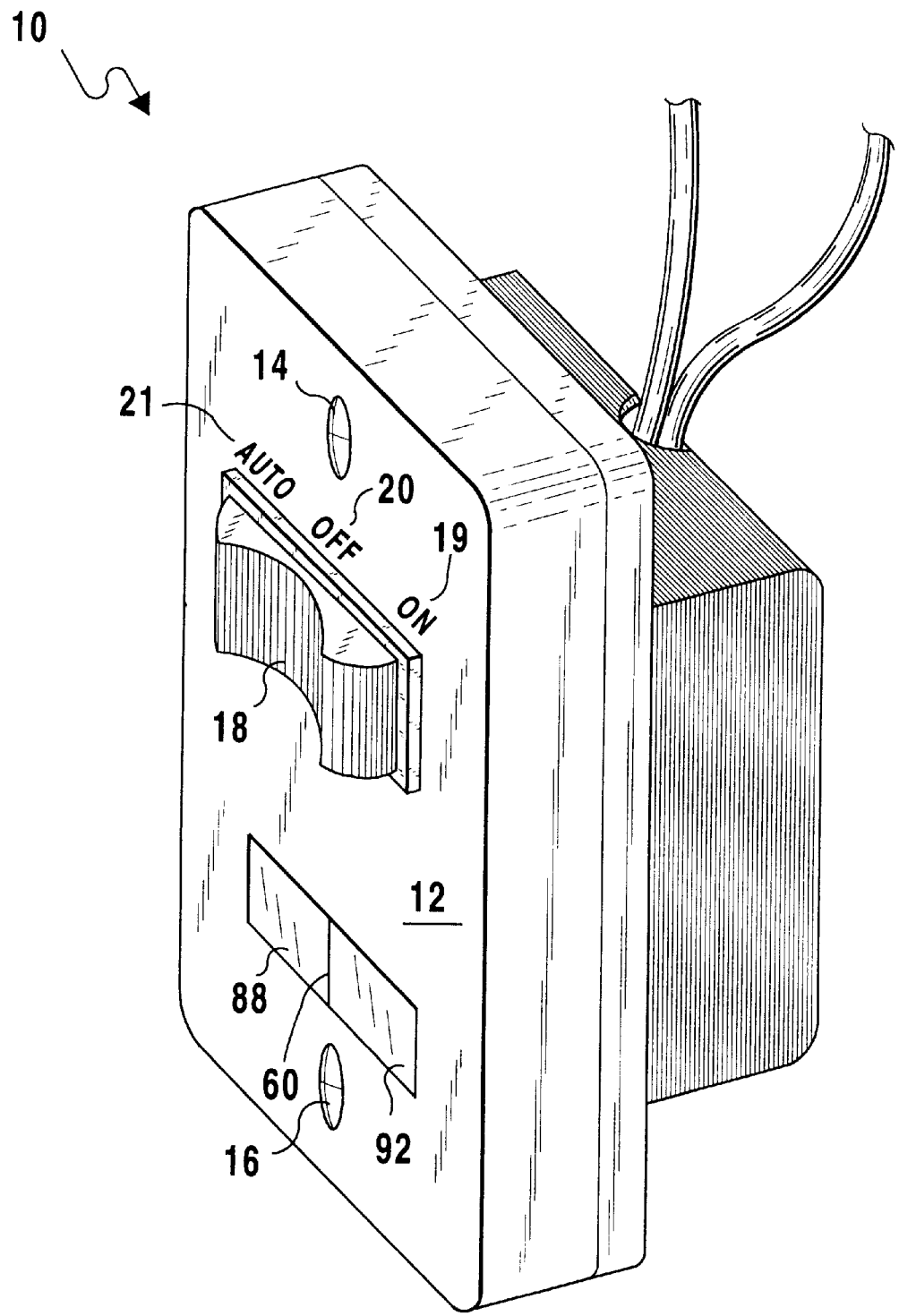
FIG. 1 is a front perspective view of the infrared proximity and remote control wall switch of the present invention.

A perspective view of the infrared proximity and remote control wall switch 10 is illustrated in FIG. 1. The infrared proximity and remote control wall switch 10 includes a face plate 12. The face plate 12 is visible when positioned on a wall as is a conventional electrical switch. A top screw 14 and a bottom screw 16 are visible extending through the face plate 12 for securing the infrared proximity and remote control wall switch 10 to the wall. Also extending from the face plate 12 is a three position switch 18 which is manually controlled to operate between an "ON" position 19, an "OFF" position 20 and an "AUTO" position 21. An infrared light filter 60 is present on the face plate 12 to let infrared signals through to and from the infrared receiver 88 and infrared emitter 92 behind.

Figure 2:
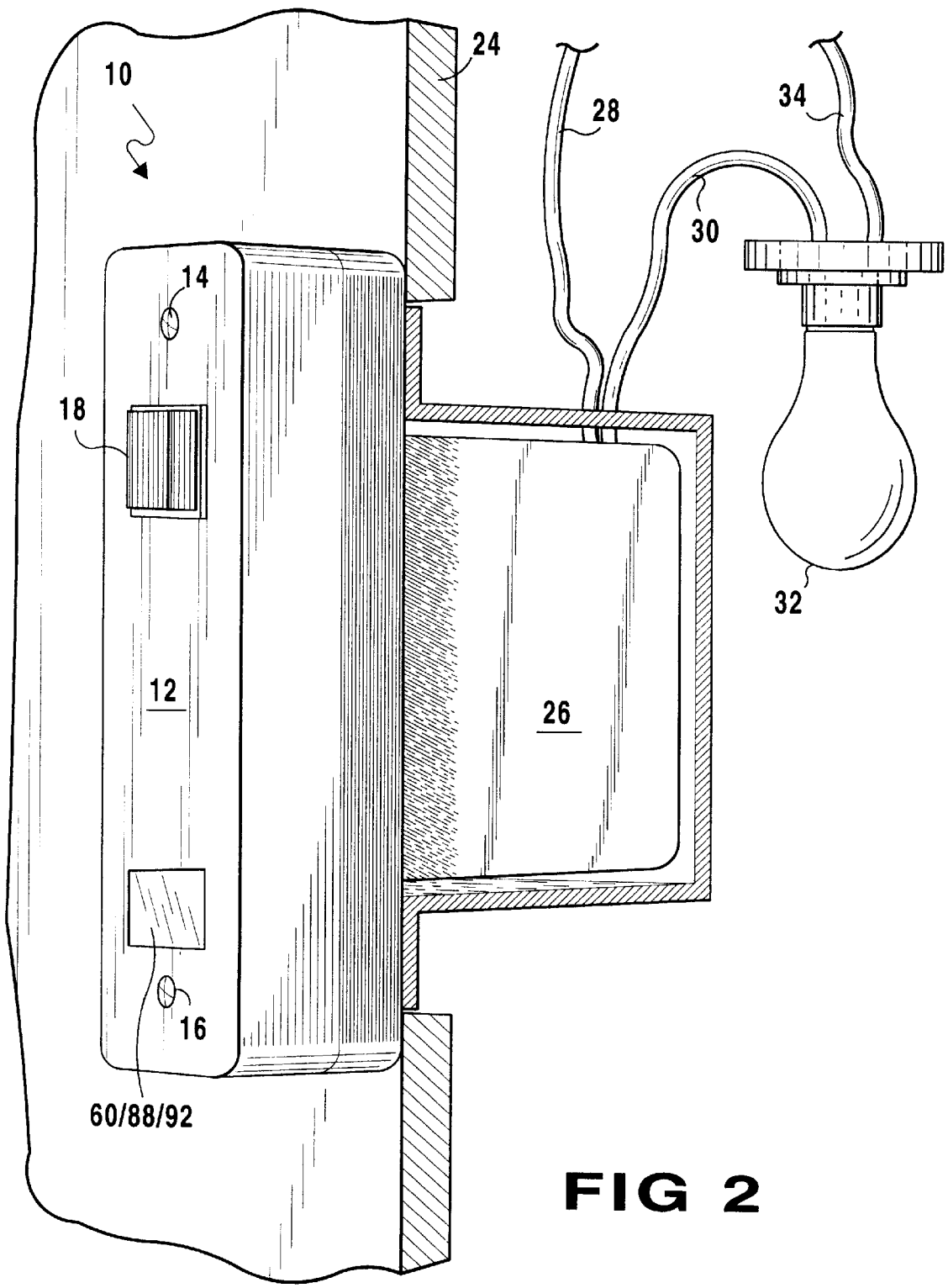
FIG. 2 is a side perspective view of the infrared proximity and remote control wall switch of the present invention.

A side view of the infrared proximity and remote control wall switch 10 is illustrated in FIG. 2. From this view, the connection between the infrared proximity and remote control wall switch 10 and the wall 24 is clearly seen. Extending from the face plate 12 and within the wall 24 is an electrical switch box 26. The electrical switch box 26 contains the electrical operating circuitry for the infrared proximity and remote control wall switch 10 and will be discussed in greater detail hereinafter. Extending into the electrical switch box 26 for connection to the electrical operating circuitry is a 120 volt AC source lead line 28. Exiting the electrical switch box 26 is a connection wire 30 for connecting a first terminal of a fixture 32 to the internal circuitry of the infrared proximity and remote control wall switch 10. A neutral wire 34 is connected to a second terminal of the fixture 32.

Figure 3:
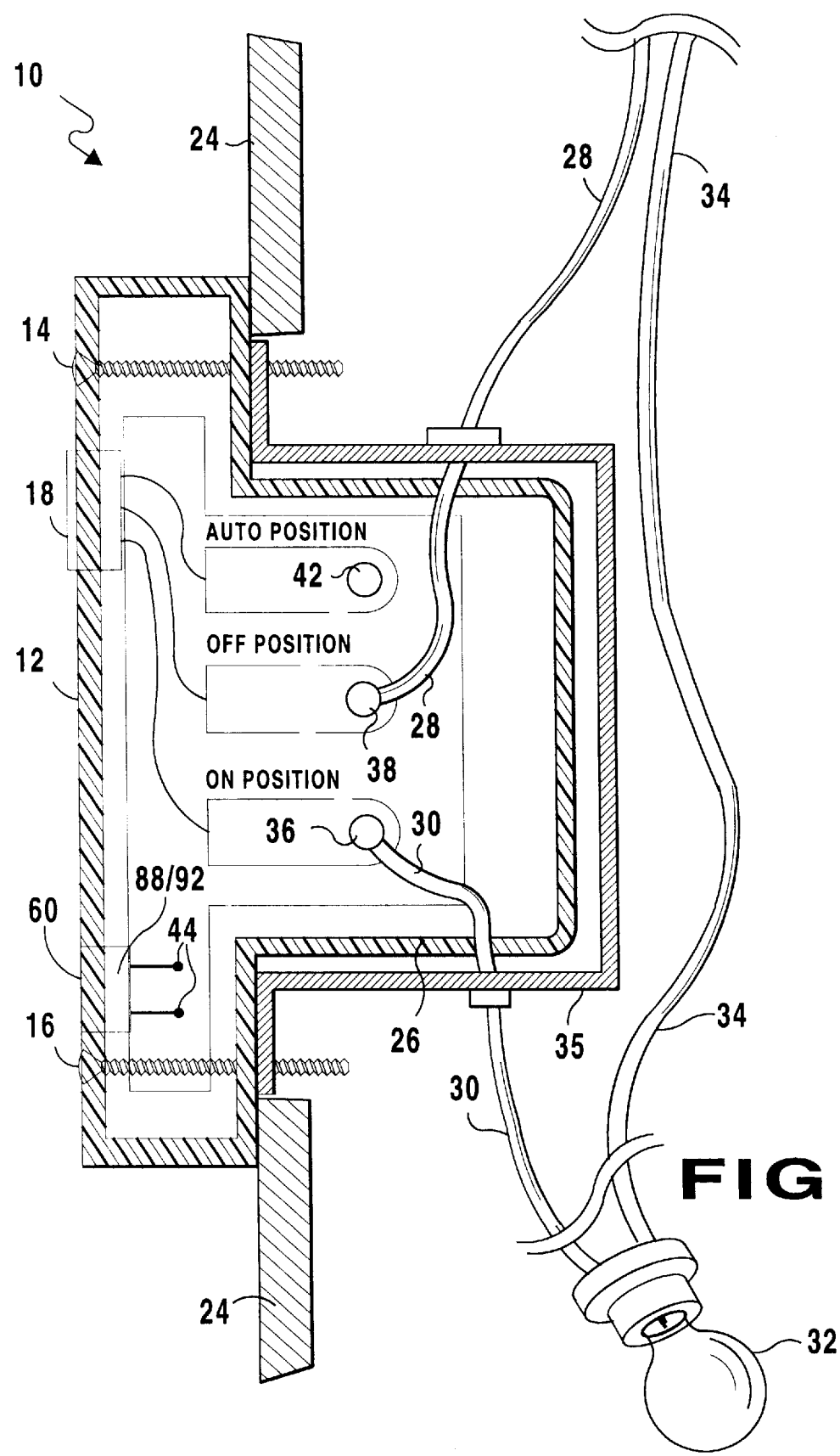
FIG. 3 is a side cross-sectional view of the infrared proximity and remote control wall switch of the present invention.

A cross-sectional view of the infrared proximity and remote control wall switch 10 is illustrated in FIG. 3 showing internal components of the electrical switch box 26. As can be seen from this view, the electrical switch box 26 is positioned within a recess 35 within the wall 24 and the three position switch 18 is connected to three terminals within the electrical switch box 26, each defining a particular position of the switch 18. A first terminal 36 is connected to the switch 18 when in the ON position to thereby connect the 120 volt AC source lead line 28 to the fixture 32 via a second terminal 38. The second terminal 38 is connected directly to the 120 volt AC source lead line 28 and, when placed in the "OFF" position, the switch 18 disconnects the 120 volt AC source lead line 28 from the fixture 32. When the switch 18 is in the "AUTO" position the switch 18 is connected to a terminal 42. Terminal 42 connects the fixture 32 to the 120 volt AC source lead line 28 via the internal circuitry of the electrical switch box 26. The terminals 44 positioned behind the infrared light filter 60 connect the infrared emitter and receiver to the electrical operating circuitry within the electrical switch box 26 as will be described in greater detail hereinafter.

Figure 4:
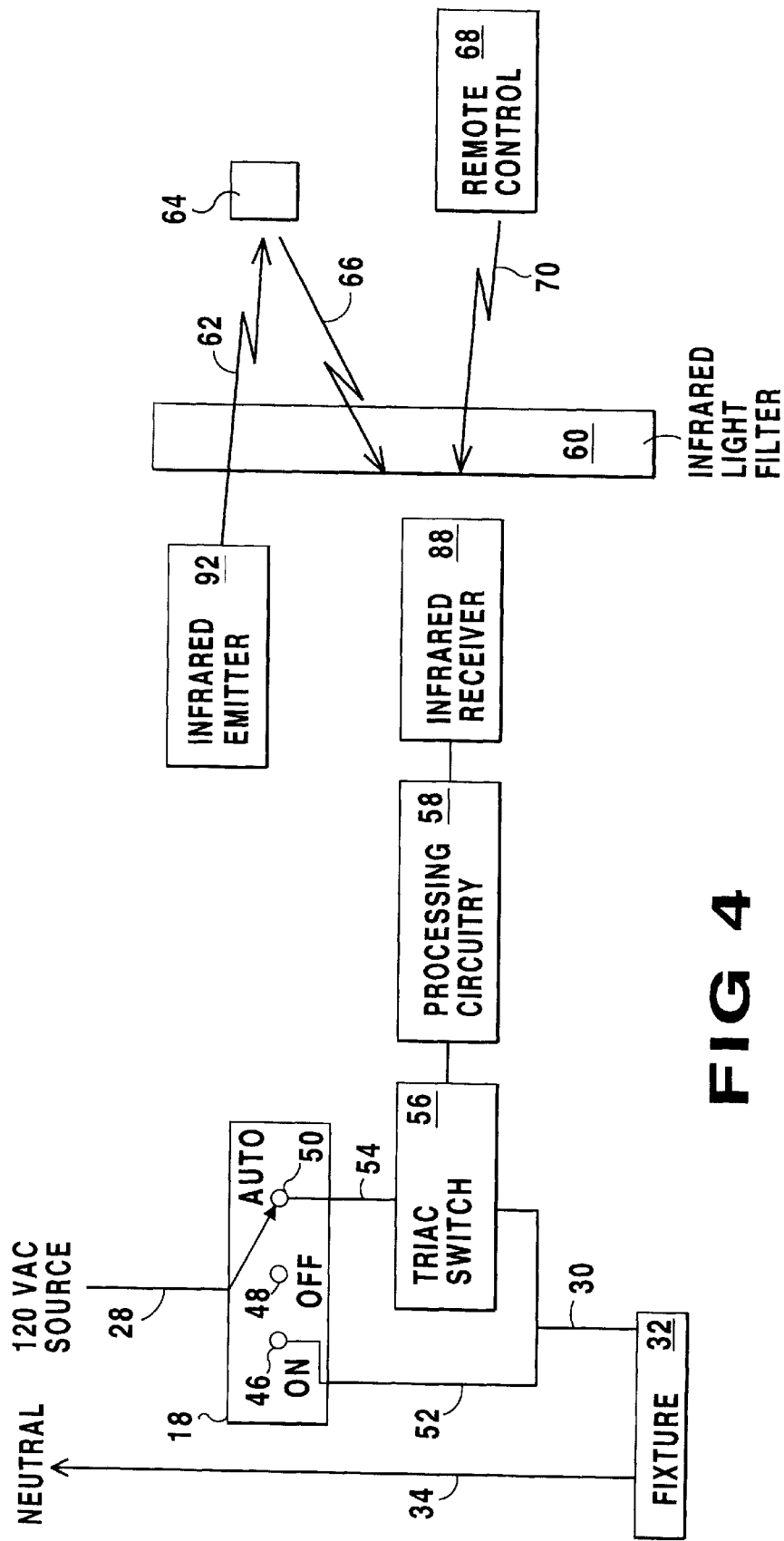
FIG. 4 is a block diagram of the infrared proximity and remote control wall switch of the present invention.

A block diagram of the internal components of the electrical switch box 26 is illustrated in FIG. 4. As can be seen from this figure, the fixture 32 is connected between the neutral line 34 and the 120 volt AC source when the switch 18 is in either the ON position or AUTO position, i.e. when the 120 volt source is connected to either terminal 46 or 50 of the switch 18. When the 120 volt AC source is connected to terminal 48 of the switch 18, the switch is in the OFF position and the 120 volt AC source is disconnected from the fixture 32. The ON terminal 46 connects the 120 volt AC source directly to the fixture 32 via a connection line 52 to turn the fixture 32 on.

The AUTO terminal 50 of the switch 18 is connected to a triac switch 56 via a lead line 54 and connects the 120 volt AC source to the fixture 32 via the triac switch 56. The triac switch 56 is connected to and triggered by the processing circuitry 58 of the electrical switch box 26. Also contained within the electrical switch box 26 are an infrared emitter 92 and an infrared receiver 88. The infrared emitter 92 transmits an infrared signal indicated by the arrow labeled 62 through the infrared light filter 60 to the area surrounding the infrared proximity and remote control wall switch 10 and illuminated by the fixture 32. When an object 64 passes in front of the emitted infrared signal 62 causing the infrared signal to be reflected back towards the infrared light filter 60 as indicated by the arrow labeled 66, it is detected by the infrared receiver 88. Any infrared signal such as that indicated by the arrow labeled 70 emanating from a remote control unit 68 and passing through the infrared light filter 60 will also be detected by the infrared receiver 88. The infrared signal 70 may be generated by any conventional remote control such as that used to control a television, video cassette recorder or any other electrical device. Furthermore, the infrared proximity and remote control wall switch 10 may be activated by pressing any key on the remote control 68. The signals detected by the infrared receiver 88 are transmitted to the processing circuitry 58 which upon analysis of the signal acts to trigger the triac switch 56. When the triac switch 56 is triggered to conduct and the switch 18 is in the AUTO position, the 120 volt AC source is caused to be directly connected to the fixture 32 causing the fixture 32 to illuminate.

Figure 5:
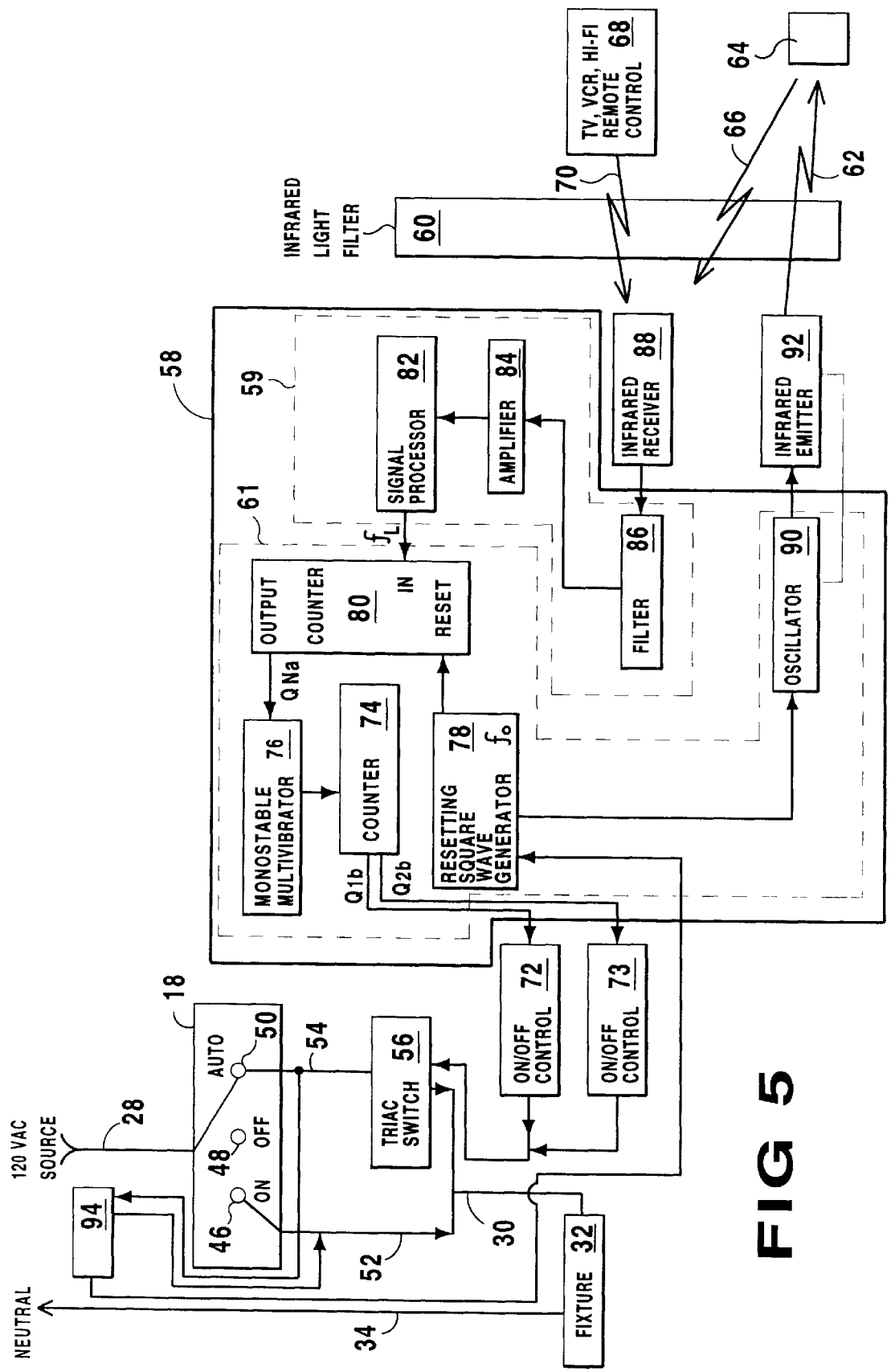
FIG. 5 is a block diagram of the infrared proximity and remote control wall switch of the present invention in more detail than FIG. 4.

FIG. 5 illustrates the processing circuitry 58 in greater detail. In this figure, a counter 80 is a N-bit binary counter used to perform noise rejection and signal selection for the infrared proximity and remote control wall switch 10. The frequency division factor of counter 80 is M, whereby M equals 2, 4, 8, 16, 32, . . . , depending upon which output bit $Q_N$ of counter 80 is chosen. If M is chosen from the Nth (N=1, 2, 3, 4, 5, . . . ) bit of counter 80, the relationship between M and N is $M=2^N$.

When an infrared signal, 66 or 70, is received by infrared receiver 88 it is converted into an electrical signal, and passed through a filter 86, an amplifier 84 and a signal processor 82. The electrical signal is then converted into a transistor-transistor logic (TTL) pulse with pulse frequency $F_L$ and applied to the input of counter 80. The resetting square wave generator 78 converts a sine wave having a frequency equal to the utility power line frequency $f_0$, wherein $f_0$=50 hertz, 60 hertz or any other value, received from power supply 94 into a square wave having a period $T_0$, wherein $T_0=1/f_0$, as a resetting square wave. The resetting square wave may also be generated by other methods having a different value for $f_0$ and the duty cycle of resetting square wave can be set to different values to achieve the same goal. The resetting square wave is then applied to the reset pin of counter 80 to reset counter 80 during every positive half cycle of the resetting square wave. Since the resetting signal is a square wave, counter 80 is reset upon receipt of the positive half cycle of the square wave, the reset time lasting for a complete positive half cycle of the resetting square wave. In other words, counter 80 is only counting during the negative half cycle of the resetting square wave or during the negative half of the period of $T_0$.

One output bit $Q_{Na}$ of counter 80 (where N is the Nth bit of counter 80 and N=1, 2, 3, 4, . . . ) is chosen to trigger next stage circuits. When counter 80 is counting, triac 56 is triggered on or off when the chosen output bit $Q_{Na}$ of counter 80 changes its state from low to high thus turning the fixture 32 on or off.

Figure 8:
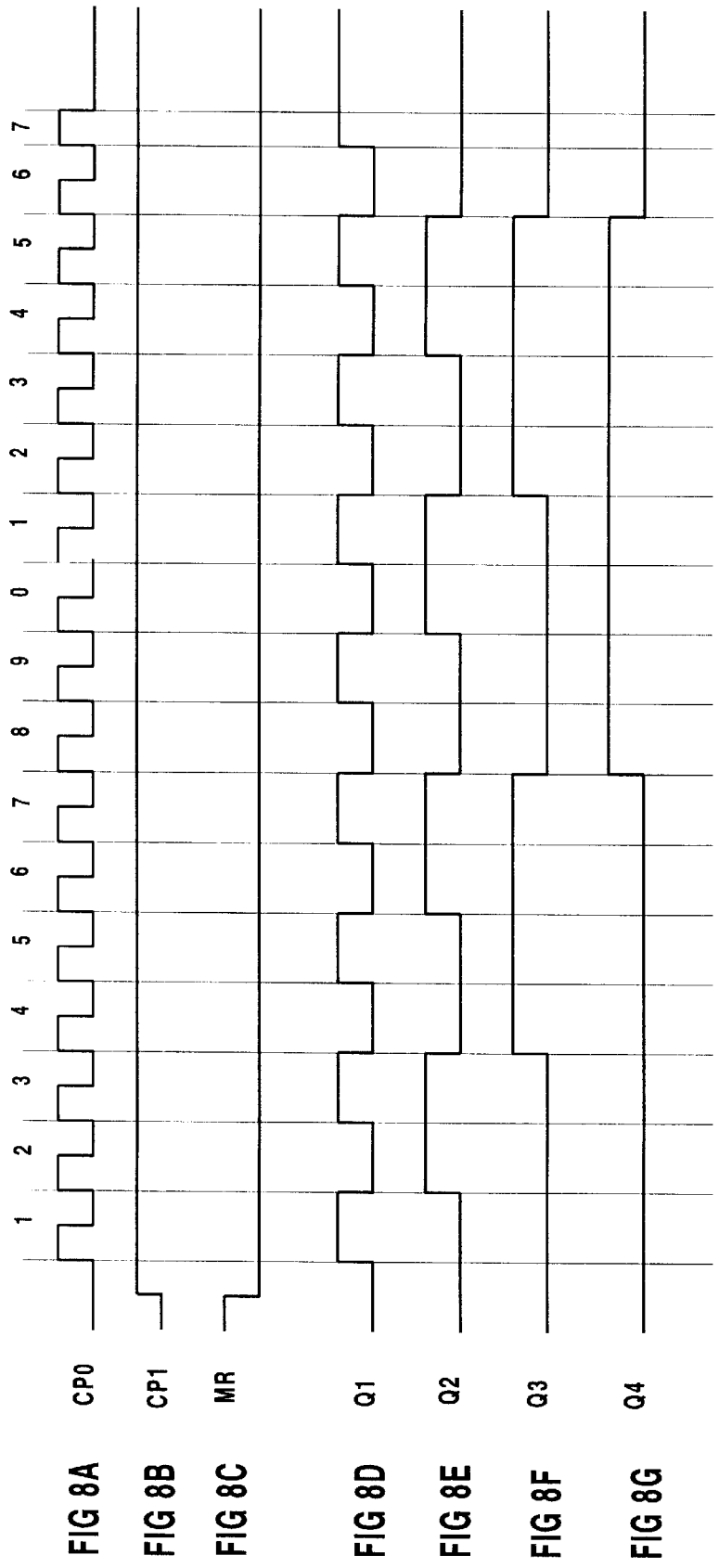
Figure 9A:
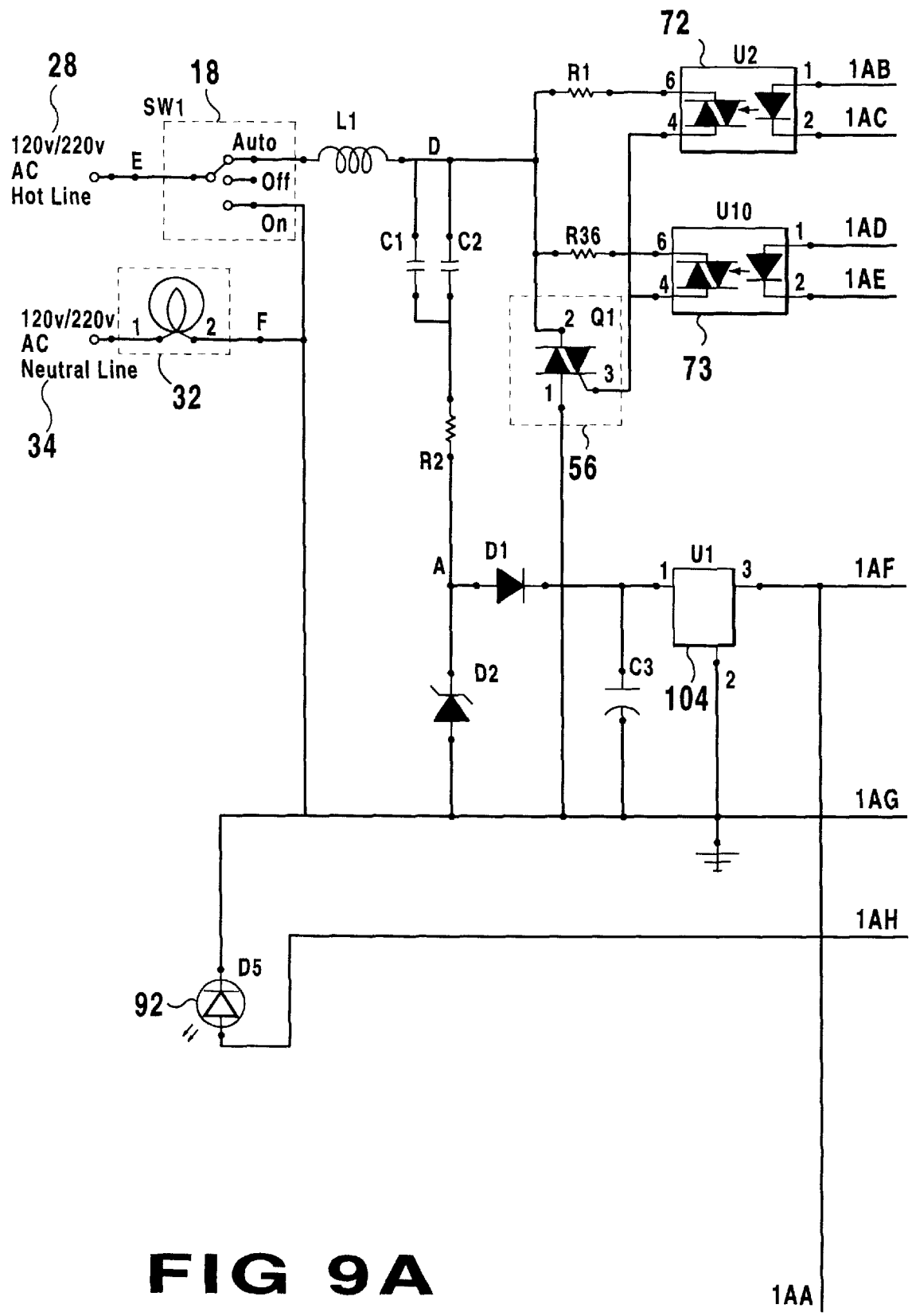
Figure 9B:
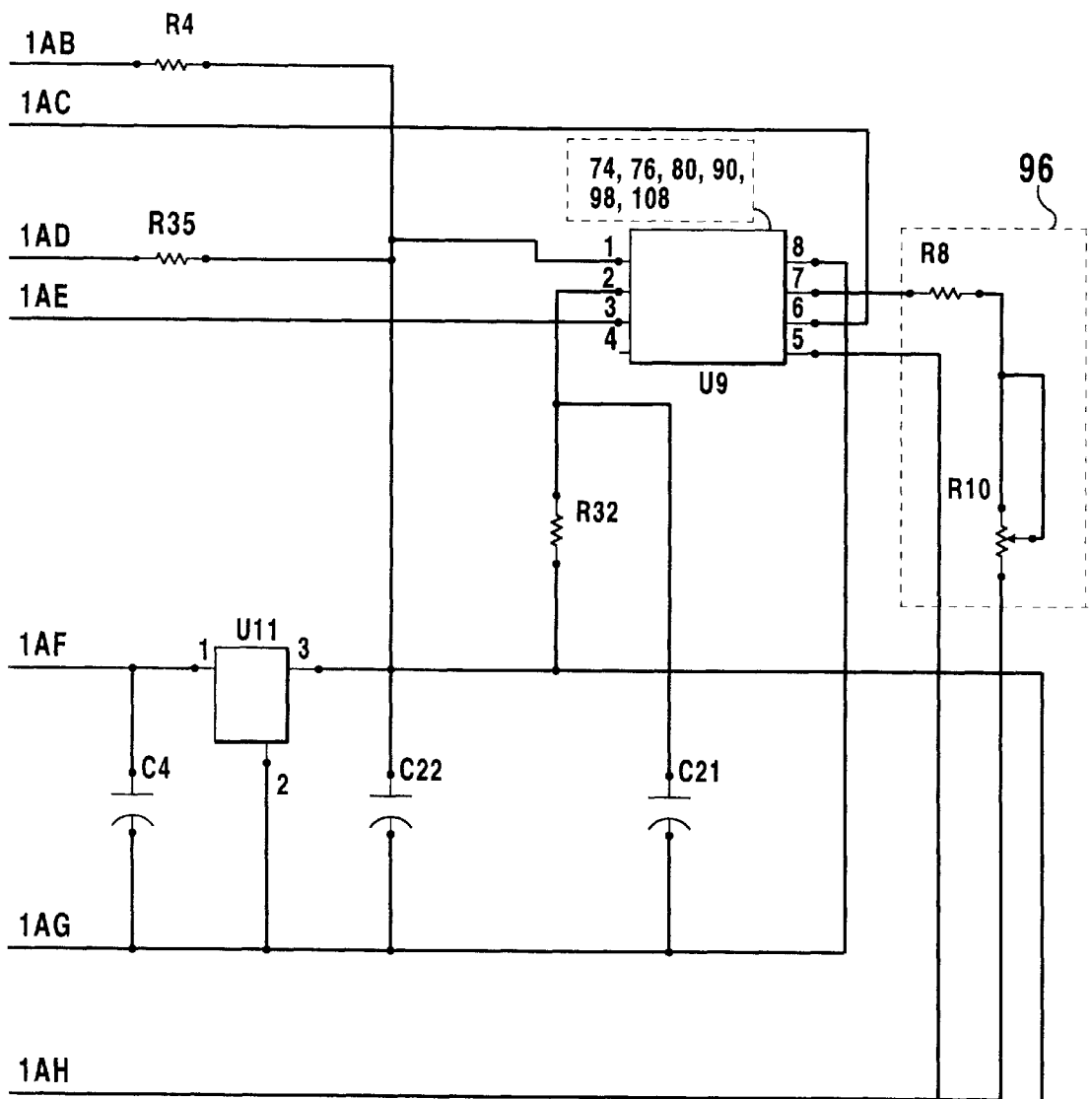
Figure 9C:
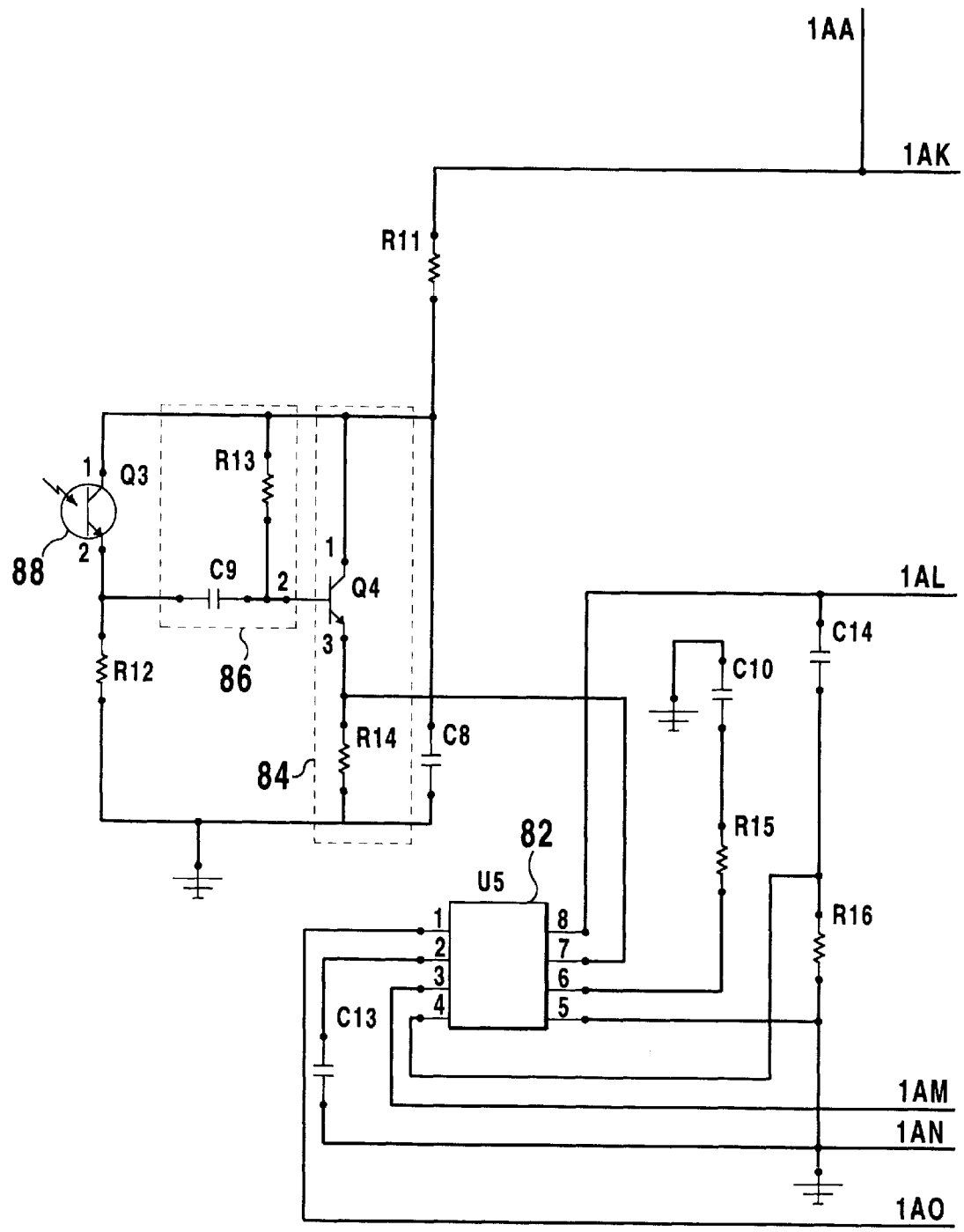
Figure 9D:
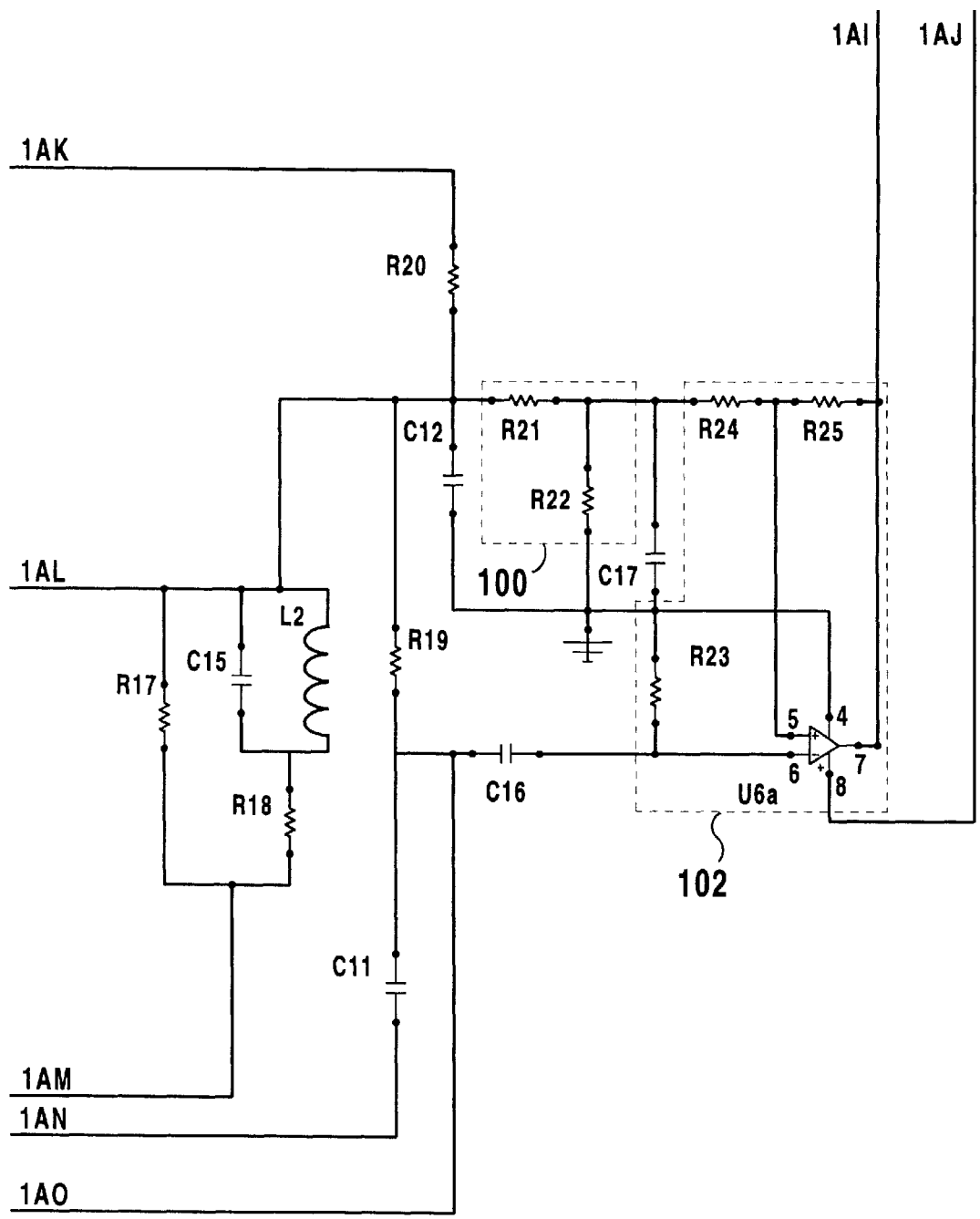

As we are only using the first state change at the chosen output $Q_{Na}$ of counter 80 as a trigger signal, the Nth output bit $Q_{Na}$ will change its state from logic low, "0", to logic high, "1", when counter 80 counts to M/2 as is illustrated in the timing diagram of counter 80 in FIG. 8. When counter 80 is counting up to M/2, the Nth output bit $Q_N$ of counter 80 will change its state from low to high to thereby trigger a monostable multivibrator 76. The monostable multivibrator 76 then triggers counter 74 which in turn triggers on/off controls 72 and 73. The on/off controls 72 and 73 then trigger triac 56 to turn the fixture 32 either on with differing levels of intensity or off. Since the counting time of counter 80 is only $T_0/2$, in order to have counter 80 count up to M/2 and trigger the rest of the circuit, the input signal to counter 80 must be fast enough to produce at least M/2 ($M=2^N$) pulses during the count time period of $T_0/2$. In other words, the frequency of input signal $f_L$ with respect to counter 80 must be at least M times $f_0$, i.e. $f_L > Mf_0$, in order to allow counter 80 to count up to M/2 and trigger the remainder of the circuit. From a noise rejection point of view, any signal having a frequency lower than $f_L$, e.g. ripple noise from a power line frequency, its lower order harmonics and other low frequency signals, will be rejected by counter 80. Any signal with a frequency higher than $f_L$, but does not last long enough to produce M/2 or more pulses in the time period $T_0/2$, such as noise caused by switching on/off other appliances and lights nearby, will also be rejected by counter 80. In other words, counter 80 functions to reject noise from power line frequency signals and noise caused by switching other appliance and lights on or off, thereby insuring that the fixture 32 is free from being activated by noise signals. Filter 86 and signal processor 82 act to filter the remainder of the high frequency noise. For example, when the output is chosen from the $3^{rd}$ (N=3) bit $Q_{3a}$ of counter 80 and the AC line frequency fo is sixty (60) hertz, the input signal frequency $f_L$ must be at least eight ($2^3=8$) times sixty hertz or higher ($f_L > 8 \times 60$ Hz=480 Hz), in order to change the 3rd bit $Q_{3a}$ of counter 80 from low to high. Any demodulated signal with a frequency lower than 480 hertz, or any signal with a higher frequency but does not last four cycles in half of one-sixtieth, 1/60, seconds will not contribute a state change from low to high at the 3rd bit $Q_{3a}$ of counter 80.

With proper selection of the frequency division factor M, counter 80 will accept the reflection of the signal generated by oscillator 90 and conventional signals received from conventional remote controls such as those used for controlling a TV, VCR or home entertainment units 68 to turn the fixture 32 either on or off while still rejecting unwanted noise signals. The higher the frequency division factor M, the higher noise immunity of the infrared proximity and remote control wall switch 10 and the less compatible the infrared proximity and remote control wall switch 10 will be with conventional remote controls for TV's, VCR's and home entertainment units. It is to be realized that the use of the counter 80 as described is for purposes of example only and that other counters may be used as long as they are able to perform the functions required and as described above.

In FIG. 5, an AC hot line, i.e. the 120 volt AC source, is connected to the infrared proximity and remote control wall switch 10. The floating DC power supply circuit 94 takes an AC leak current through fixture 32 to generate DC voltages for use by the infrared proximity and remote control wall switch 10. The infrared proximity and remote control wall switch 10 is series connected with the 120 volt AC line, functioning like any conventional electric switch. Oscillator 90 generates a series of modulated voltage pulses having a frequency in the kilo-hertz range to drive the infrared emitter 92 as a source of infrared radiation. An infrared light filter 60 blocks non-infrared light while only allowing infrared light to pass therethrough thereby reducing interference from non-infrared light. The infrared light filter 60 is preferably made of plastic although any material which will allow the infrared signals to pass therethrough unimpeded may be used. When either an object 64 is moved close to and in front of the infrared emitter 92 and then removed within approximately one second, a person waves his hand in front of the infrared emitter 92, or a button on any regular TV, VCR or hi-fi remote control 68 is pressed and released while being pointed at the infrared receiver 88, infrared receiver 88 detects the infrared signals, converts the infrared signal to an electrical signal and transmits the electrical signal to a band pass filter 86. The band pass filter 86 filters out low and high frequency signals from the received electrical signal and allows signals within the desired frequency range to pass through to amplifier 84. Amplifier 84 amplifies the received signal and delivers the amplified signal to signal processing unit 82. Signal processing unit 82 demodulates the received signal, converts the demodulated signal into a TTL signal and outputs the TTL signal to the input of counter 80. In other words, counter 80 functions as a noise rejecter, rejecting noise from power line frequency signals and noise caused by switching on/off other appliances and lights to assure that the infrared proximity and remote control wall switch 10 is not activated by a mistakenly analyzed signal.

When the Nth bit output $Q_{Na}$ of counter 80 changes its state from low to high, it triggers monostable multivibrator 76, which then generates a delay pulse. The delay time of monostable multivibrator 76 is set long enough to prevent multiple triggers in a short period of time while either passing an object in front of the infrared beam 62 or directing an infrared signal 70 from a conventional remote control 68 multiple times. The delay pulse then triggers counter 74 to count and to change the state of its output bits; the first trigger to counter 74 turns the first output bit $Q_{1b}$ of counter 74 to high, the second trigger will turn the first output bit $Q_{1b}$ of counter 74 back to low and turn the second output bit $Q_{2b}$ of counter 74 from low to high, the third trigger will turn both the first output bit $Q_{1b}$ and the second output bit $Q_{2b}$ of counter 74 to high, and the fourth trigger will bring both the first output bit $Q_{1b}$ and second output bit $Q_{2b}$ of counter 74 back to low again to complete a control cycle. The first output bit $Q_{1b}$ and the second output bit $Q_{2b}$ of counter 74 then drive on/off control circuits 72 and 73 respectively which then drive triac 56 to be conducted in different current levels or cut off. When the first output bit $Q_{1b}$ and the second output bit $Q_{2b}$ of counter 74 are high, the on/off controls 72 and 73 are both driven on. When the first output bit $Q_{1b}$ and the second output bit $Q_{2b}$ of counter 74 are low, the on/off controls 72 and 73 are both driven off. When on/off control 72 is on and on/off control 73 is off, triac 56 is driven to be conducted in the first pre-set current level. When on/off control 72 is off and on/off control 73 is on, triac 56 is driven to be conducted in the second pre-set current level. When both on/off controls 72 and 73 are on, triac 56 is driven to be conducted in a non-linear sum of the first and second pre-set current levels. When both on/off controls 72 and 73 are off, triac 56 is off. When triac 56 is conducting, AC voltage is applied to the fixture 32 through triac 56 to turn the fixture 32 on. When different levels of current pass through the fixture 32, the fixture 32 is turned on at different intensity levels; the higher the current passing through, the greater the intensity. When triac 56 is cut off, the fixture 32 is also turned off. The AC neutral line is connected to the other end of the fixture 32 to close an AC power circuit loop. If on/off control 73 is removed, the fixture 32 can be either turned on without intensity selection or off.

The function of the digital section 61 in FIG. 5 can be implemented by a micro-controller and the addition of an intelligent learning and memorizing/de-memorizing control signal. The following describes how the intelligent learning and memorizing/de-memorizing control signal with micro-controller implementation works (see FIG. 9 and FIG. 10):

Normally, the infrared proximity and remote control wall switch 10 is controlled by arbitrarily pressing a button on any conventional TV, VCR, hi-fi remote control unit. With the micro-controller implementation, the infrared proximity and remote control wall switch 10 can be programmed by an end user to accept a control signal only by pressing one particular button on the conventional TV, VCR or hi-fi remote control unit as desired by the user, pressing other buttons on the conventional TV, VCR or hi-fi remote control unit will no longer be able to control turning the infrared proximity and remote control wall switch 10 on or off after programming by the user. When a user decides which button on the conventional TV, VCR or hi-fi remote control unit is desired for use as the only button to control the turning on and off of the infrared proximity and remote control wall switch 10, one must then simply press and hold that button while pointing the remote control at the infrared proximity and remote control wall switch 10 while counting the number of times the fixture 32 changes its state from on to off. The button is then released when the count reaches five (or more, depending on the set up of micro-controller U9 in FIG. 9 and FIG. 10). This programs the infrared proximity and remote control wall switch 10, i.e. the infrared proximity and remote control wall switch 10 has learned and memorized, to accept only a signal generated in response to pressing of that button to perform the desired feature, in this instance turning the fixture on and off. This programming (or learning) does not effect the function of turning the fixture 32 on or off by waving one's hand (or object 64) close to and in front of the apparatus; i.e. proximity control. If the user wants to erase the memory of the programmed button and return to normal operation, the user can either press and hold the programmed button while pointing the remote control at the infrared proximity and remote control wall switch 10 and then count the number of times the fixture 32 changes state from on to off, releasing that button when the count reaches ten (or above ten, depending upon the set up of micro-controller U9). If the user forgets which button had been programmed, the user can hold his hand close to and in front of the infrared proximity and remote control wall switch 10 and count the number of times the fixture 32 changes state from on to off, stopping when the count reaches ten (or above ten, depending on the set up of micro-controller U9). This will act to erase the memory of the programmed button with the infrared proximity and remote control wall switch 10 returning to its normal operational function; the infrared proximity and remote control wall switch 10 will now accept control signals by pressing any button of any conventional TV, VCR, hi-fi remote control.

When using micro-controller implementation, oscillator 90 can be programmed to generate an encoded pulse signal to the drive infrared emitter 92 for proximity control, thus further improving the noise immunity.

FIGS. 7A–7D illustrate a schematic diagram of the infrared proximity and remote control wall switch 10 of the present invention. Timer U3a, capacitors C6 and C7, resistors R7 and R9 and diode D4 form oscillator 90 which produces a square wave having a frequency of about 1 Khz to drive infrared emitter 92. Resistors R7 and R9, diode D4 and capacitor C6 act to determine the frequency and duty cycle ratio of the square wave. Diode D4 shortens the charging time of capacitor C6 whereby the duty cycle ratio is less than one. Capacitor C7 acts to by-pass noise in timer U3a to ground thereby stabilizing the function of timer U3a. The emitted infrared signal from diode D5 is for the use of the proximate switching function of the infrared proximity and remote control wall switch 10. The source of the infrared signal for remote control function is provided by a remote control unit for TV, VCR and other home entertainment units 68.

Infrared emitter 92 and infrared receiver 88 are mounted on the same surface of the infrared proximity and remote control wall switch 10 as can be seen from FIG. 1. When an object 64 such as a person's hand is placed close to and in front of infrared emitter 92 and infrared receiver 88 then removed, part of emitted infrared signal from infrared emitter 92 is reflected back to infrared receiver 88. The infrared receiver 88 receives the reflected infrared signal and converts it into an electrical signal for the use by the remainder of the circuit to control the turning on and off of the fixture 32. Resistors R8 and R10 are positioned between oscillator 90 and infrared emitter 92 to limit current flowing into the infrared emitter 92 from oscillator 90. Changing the values of resistors R8 or R10 can change the output intensity of infrared signal from the infrared emitter 92 and thus change the sensitivity of the proximate switching function, i.e. changing the value of resistors R8 or R10 can change the effecting action distance between an object and the infrared emitter 92 and infrared receiver 88. Thus the user is provided with a choice regarding the distance at which an object may be placed from the infrared receiver 88 to turn the fixture 32 on or off.

A complete signal processor includes filters, amplifiers and wave form transformers to eliminate noise signals received by the infrared receiver 88 and to amplify and reshape the desired signal for trigging the control circuit in next stages on and off. Capacitor C8 and resistor R11 form a high frequency decoupling circuit for bypassing high frequency noise signals from power supply to circuit ground (circuit common, not earth ground). Capacitor C9 and resistor R13 form a high pass filter to block transferring low frequency (under a couple hundreds hertz) noise from infrared receiver 88 to npn transistor Q4. Resistors R13 and R14 also set the DC quiescent operating condition of transistor Q4. Transistor Q4 acts as an emitter follower to amplify the received signal current for transmission to pin 7 of the signal processor 82 for further signal processing.

The signal processing IC 82 and its peripheral components perform the functions of amplification, band pass filtering, automatic gain control, and signal demodulation. After receiving a signal at pin 7, the signal processor 82 selects signals that are within the acceptable frequency range and demodulates the selected signals. The demodulated signals are then output at pin 1 of signal processor 82. Inductor L2 and capacitor C15 form an LC resonant circuit for selecting the acceptable frequency band for a signal from a remote control. Resistor R17 determines the selected frequency bandwidth. Resistor R18 determines the gain of the reflected signal received by the infrared receiver 88. Capacitors C11 and C13 bypass high frequency noise signals to circuit ground. Resistor R19 is load resistor of output pin 1 of the signal processor 82. The output signal at pin 1 of the signal processor 82 passes a high pass filter formed by capacitor C16 and resistor R23 to filter out low frequency noise, and applies the filtered signal to pin 6 of operational amplifier U6a. Operational amplifier U6a and resistors R23, R24, and R25 form Schmitt trigger 102 which transforms irregularly shaped signals received at pin 6 of the operational amplifier U6a into a regular TTL pulse for use by the digital circuit connected at its output. Resistors R21 and R22 form a voltage divider circuit for determining the trigger level of the Schmitt trigger 102. Changing the ratio of resistors R21 and R22 changes the sensitivity and the noise immunity of the entire switch. The TTL signal is output at pin 7 of the operational amplifier U6a and applied to pin 1 of counter 80.

The power line frequency $f_0$, wherein $f_0$=60 Hz or 50 Hz, signal shaping circuit is formed by resistors R3 and R4, diode D3, capacitor C5 and operational amplifier U6b. The line voltage passes through capacitors C1 and C2 and resistor R2 and is applied to the cathode of zener diode D2 to produce a square wave voltage at point A. On one path, diode D1, capacitor C3, DC voltage regulator U1, and capacitor C4 provides a regulated DC voltage at pin 3 of voltage regulator U1 to power the entire circuit. Along the other path, resistor R4 and diode D3 provide a TTL resetting square wave at point B. Resistor R3 and capacitor C5 form a low pass filter to bypass high frequency noise signals to circuit ground. A noise free resetting square wave having frequency $f_0$ is provided at point C and applied to inputs of other circuits. One is applied to pin 2 of operational amplifier U6b. The other is applied to reset pin 7 of binary counter 80. A signal inverter, formed by operational amplifier U6b and resistors R26 and R27, inverts the phase of the square wave. The inverted square wave is then output at pin 1 of the operational amplifier U6b to drive the reset pin of timer U3a to reset both binary counter 80 and timer U3a at the same time. When binary counter 80 is counting, timer U3a is also driving infrared emitter 92 to emit infrared signals. Timer U3a is reset by every positive half cycle of the resetting square wave to save the driving energy of infrared emitter 92 and also reduce the chances of error.

The positive half cycle of the resetting square wave at point C also resets counter 80 through pin 7. Since the resetting signal is a square wave, the reset time to counter 80 lasts one half of the cycle period $T_0$, wherein $T_0$=1/$f_0$, of the square wave; the duration of the positive half cycle of the square wave. Counter 80 is only counting during the negative half cycle period of the square wave when counter 80 is not being reset. When counter 80 is reset, all outputs (pins 3, 4, 5, 6) are forced to logic low state, "0000", and counter 80 has to restart a new counting cycle when counter 80 is not being reset.

Counter 80 is a four-bit binary counter to perform noise rejection and signal selection. The frequency division factor M of counter 80 equals 2, 4, 8, 16. The TTL signal from pin 7 of Schmitt trigger U6a is applied onto the input pin 1 of counter 80 as a clock signal to drive counter 80. Pin 3 (Q1a), pin 4 (Q2a), pin 5 (Q3a) and pin 6 (Q4a) of counter 80 are the first, second., third and fourth output bits of counter 80 respectively. Master reset pin 7 (MRA) of counter 80 is constantly driven by the resetting square wave at point C. When the resetting square wave is at its positive half cycle, pin 7 of counter 80 is in a logic high, "1", state, counter 80 is reset and all outputs Q1a, Q2a, Q3a and Q4a of counter 80 are forced into a logic low, "0000", state, and counter 80 stops counting even there is clock signal at pin 1. When the resetting square wave changes from its positive half cycle into its negative half cycle, pin 7 of counter 80 is in a logic low, "0" state, counter 80 starts to count from its all logic low, "0000", state. When counter 80 counts one clock signal at pin 1, output Q1a changes its current state from logic low to logic high, Q4a, Q3a, Q2a, Q1a="0001"; when counter 80 counts two clock signals at pin 1, output Q2a changes its current state from logic low to logic high, Q4a, Q3a, Q2a, Q1a="0010"; when counter 80 counts four clock signals at pin 1, output Q3a changes its current state from low to high, Q4a, Q3a, Q2a, Q1a="0100"; when counter 80 counts eight clock signals at pin 1, output Q4a changes its current state from low to high, Q4a, Q3a, Q2a, Q1a="1000". The duration of counting time only lasts half cycle period of the resetting square wave ($T_0/2$), and counter 80 will be reset again when the next positive half cycle of resetting square wave comes in. One of the outputs $Q_{Na}$, wherein N=1, 2, 3, 4, of counter 80 can be chosen as a trigger signal to trigger the next stage circuit depending on what frequency range of signal we want to select and what frequency range of noise we want to reject. Ranging from $Q_{1a}$ through $Q_{4a}$, choosing $Q_{1a}$ provides the lowest noise rejection ability but have widest signal selection compatibility; choosing $Q_{4a}$ provides the highest noise rejection ability but the narrowest signal selection compatibility. In the case of considering the compatibility of the infrared proximity and remote control wall switch 10 with any regular remote control of TV, VCR, and other home entertainment units, we choose $Q_{3a}$, which is the third bit at pin 5 of counter 80 as the output to trigger the next circuit.

When $Q_{3a}$ of counter 80 is chosen, its frequency division factor M is eight, i.e. $M=2^N; M=2^3=8$. If the line frequency $f_0$ is sixty (60) hertz, then any clock signal at pin 1 with a frequency lower than $f_L$, i.e. $f_L$=Mx $f_0$=8×60 Hz=480 Hz, will be rejected, and any clock signal at pin 1 with frequency higher than $f_L$ but does not last four cycles, i.e. half the M for half the time $T_0$ (M/2=8/2=4), or more will also be rejected, as previously discussed. In real life, the frequency of noise from power line (60 or 50 Hz) is lower than $f_L$, and even though the frequency of noise signals caused by switching other appliances and lights nearby on and off maybe higher than $f_L$ but normally does not last up to four (4) cycles in the time period $T_0/2$, wherein $T_0/2$=(1/60)×(1/2)= 0.008333 seconds=8.333 milliseconds, thus all these noises are rejected by counter 80. On the other hand, since the emitted infrared signal from infrared emitter 92 and the demodulated signal from regular remote control of TV, VCR and other home entertainment have the frequency range higher than 480 hertz, they are able to contribute a state changes from low to high at output $Q_{3a}$ of counter 80 during operation. This guarantees the infrared proximity and remote control wall switch 10 has the extremely high noise immunity at the same time has very wide compatibility with any conventional remote control of TV, VCR and home entertainment units.

The output pulse at $Q_{3a}$ of counter 80 drives the trigger pin 8 of timer $U_{3b}$ through a differentiator formed by capacitor C18 and resistor R29. Timer $U_{3b}$, resistor R28 and capacitor C19 form a monostable multivibrator 76. Diode D6 acts as a DC clamping diode to ensure the trigger signal at pin 8 of timer $U_{3b}$ has the proper voltage parity required by timer $U_{3b}$. The monostable multivibrator 76 is set to respond to its input trigger signal at pin 8 of timer $U_{3b}$ only once within about one second, if there are more than one trigger at pin 8 of monostable multivibrator 76, monostable multivibrator 76 will only respond the first trigger and ignore the rest, thus avoiding multiple triggering actions when a person's hand is placed in front of the infrared proximity and remote control wall switch 10 to operate the infrared proximity and remote control wall switch 10 and not removed in about one second. Resistor R28 and capacitor C19 determine the time span between two output triggers that timer $U_{3b}$ can produce at output pin 9. When timer $U_{3b}$ receives a trigger at pin 8, the output pin 9 of timer $U_{3b}$ will change its states from logic low, "0", to logic high, "1", and stay at high for about one second, then automatically return to logic low state itself and wait for the arrival of the next trigger signal. When output pin 9 of timer $U_{3b}$ is at its high state, timer $U_{3b}$ will ignore any trigger signal at input trigger pin 8. In other words, timer $U_{3b}$ only responds to the trigger signal at pin 8 when output pin 9 is in a logic low state. Output pin 9 of $U_{3b}$ is connected to the clock input pin 9 of counter 74.

Counter 74 is a four-bit counter. The outputs are taken from Q1b and Q2b of counter 74 for two bit counting. Counter 74 is always in counting mode. Transistor Q2, resistors R1, R4 , R5 and R6, and optical isolator U2 form on/off control 72. Symmetrically, transistor Q5, resistors R33, R34, R35 and R36, and optical isolator U10 form on/off control 73.

Initially all outputs of counter 74 are in logic low state and fixture 32 is off, pins Q2b and Q1b of counter 74="00". When the first pulse arrives at the clock input CP0b of counter 74, the output Q1b of counter 74 changes its state from logic low to logic high and stay as logic high and output Q2b of counter 74 is still in logic low, pins Q2b and Q1b of counter 74="01". The high voltage level at Q1b of counter 74 then drives npn transistor Q2 into a saturated (or conducting) state through resistor R5. Pin 1 of transistor Q2 is then pulled to the circuit ground, as is pin 2 of optical isolator U2, and the LED diode inside optical isolator U2 is on generating an optical signal to drive pin 4 and pin 6 of optical isolator U2 into a conducting state. When pin 4 and pin 6 of optical isolator U2 are conducting, high voltage at point D is applied to pin 3 of triac Q1 through resistor R1 and the triac inside optical isolator U2, driving triac Q1 into a conducting state. When pin 4 and 6 of optical isolator U2 is conducting, resistor R1 determines the amount of current going through triac Q1 and fixture 32 thus determining the intensity or brightness of fixture 32; we assign this intensity level 1. When triac Q1 is conducting, utility power line voltage is applied to pin 2 of fixture 32 through inductor L1 and triac Q1, thus fixture 32 is turned on and stays on until next trigger arrives at input clock pin 9 of counter 74. Pin 1 of fixture 32 is connected to utility neutral line to complete a AC power circuit loop. When the second trigger arrives at input clock pin 9 of counter 74, counter 74 counts the second trigger, its output Q1b changes state from its previously logic high to logic low and its output Q2b changes state from logic low to logic high, pin Q2b and Q1b of counter 74="10". When output Q1b of counter 74 is low, pin 2 of transistor Q2 is pulled low through resister R5, transistor Q2 is cut off as is the diode within optical isolator U2 and pins 4 and 6 of U2 and no current goes through pins 4 and 6 of optical isolator U2 to pin 3 of triac Q1. If only optical isolator U2 were driving triac Q1, triac Q1 would have been cut off. However, at the same moment, output Q2*b* of counter 74 is high and drives transistor Q5, diode in optical isolator U10, pins 4 and 6 of optical isolator U10, and placing triac Q1 into a conducting state. Fixture 32 is turned on with an intensity or brightness determined by resistor R36, this intensity is assigned level 2. When the third trigger arrives at input clock pin 9 of counter 74, counter 74 counts the third trigger. Both output pins Q1*b* and Q2*b* are logic high, i.e. pins Q2*b* and Q1*b* of counter 74="11". When both outputs Q1*b* and Q2*b* are high, transistor Q2, optical isolator U2, transistor Q5, optical isolator U10, and triac Q1 are in conductive state. The amount of current going through triac Q1 and fixture 32 is the non-linear sum of currents determined by resistors R1 and R36, thus the intensity of light at this moment is the non-linear sum of intensity level 1 and level 2, this intensity is assigned level 3. When the fourth trigger arrives at input clock pin 9 of counter 74, counter 74 counts the fourth trigger, both of its output pins Q1*b* and Q2*b* are changed back to logic low, i.e. pins Q2*b* and Q1*b* of counter 74="00". When both output pins Q1*b* and Q2*b* of counter 74 are logic low, transistor Q2, optical isolator U2, transistor Q5, optical isolator U10 and triac Q1 are cut off, no current goes through triac Q1, fixture 32 is off and stays off until the next trigger arrives at clock pin 9 of counter 74. When the fifth trigger arrives at input clock pin 9 of counter 74, counter 74 counts the fifth trigger and starts the next cycle of counting as if it were counting the first trigger. In other words, there are four states in operating this apparatus, they are fixture off, fixture on with intensity level 1, fixture on with intensity level 2, and fixture on with intensity level 3. If initially fixture 32 is off, when either an object is moved in front of the infrared emitter or an infrared signal is received by the infrared receiver from a conventional remote control unit a first time turns fixture 32 on at intensity level 1. When either an object is moved in front of the infrared emitter or an infrared signal is received by the infrared receiver from a conventional remote control unit a second time, the fixture 32 turns on at intensity level 2. When either an object is moved in front of the infrared emitter or an infrared signal is received by the infrared receiver from a conventional remote control unit a third time the fixture 32 turns on at intensity level 3. When either an object is moved in front of the infrared emitter or an infrared signal is received by the infrared receiver from a conventional remote control unit a fourth time turns fixture 32 back off. When either an object is moved in front of the infrared emitter or an infrared signal is received by the infrared receiver from a conventional remote control unit a fifth time turns fixture 32 back on at intensity level 1 repeating the next operation cycle. A combination of the outputs Q1*b*, Q2*b*, Q3*b*, Q4*b* of counter 74 and adding more transistors and optical isolators will control the light intensity more accurately. Resistors R5 and R6 are current limiters for transistor Q2. Resistors R33 and R34 are current limiters for Q5. Resistor R4 is a current limiters for optical isolator U2. R35 is a current limiter for optical isolator U10. Inductor L1 reduces AC surge current.

Switch SW1 is a three position switch, which can turn fixture 32 on and off either manually or remotely. The first position, i.e. the upper one in FIG. 7, of switch SW1 sets the switch 10 in auto working condition as described before, the entire switch 10 is connected in series with fixture 32 and AC hot line. Since the entire switch 10 is in series with fixture 32 and AC hot line, there are only two wire connections between AC line and fixture 32, thus this switch 10 can directly replace a standard electric wall switch. The second position, i.e. the lower one in FIG. 7, of switch SW1 connects AC hot line directly to fixture 32 and turns the fixture 32 on manually, no voltage is applied to auto control circuit of the apparatus. The third position, i.e. the middle one in FIG. 7, of switch SW1 connects AC hot line to an open pole, both fixture 32 and the apparatus are off.

The DC voltage power is provided by voltage regulator U1, diodes D and D2, resistor R2, capacitors C1, C2, C3 and C4, and inductor L1. AC line voltage is reduced at point A after a series circuit of inductor L1, capacitors C1 and C2, diode D2 and resistor R2 and is rectified by diode D1. The fixed DC voltage regulator U1 regulates the rectified voltage at its input pin 1 and provides a fixed and regulated DC voltage at its output pin 3 to power up the entire apparatus for the auto working condition. Capacitors C3 and C4 stabilize the DC voltage further. When triac Q2 is conducting a small part of the AC voltage remains across pin 1 and 2 of triac Q1. This small part of AC voltage remaining across pin 1 and 2 of triac Q1 continuously provide sufficient power for the use of entire switch 10.

FIG. 9 shows the use of a micro-controller to implement the same function as described in FIG. 7. The Micro-controller U9 replaces the digital section 61 of FIG. 5 and 98, 108 in FIG. 7A and FIG. 7C. The circuit of FIG. 9 is equivalent in function to that of FIG. 7. However, the circuit in FIG. 9 does not include resistors R3, R4, R5, R6, R7, R9, R26, R27, R28, R29, R33 and R34, capacitors C5, C6, C7, C18, C19 and C20, diodes D3, D4, D6, transistors Q2, Q5, timers U3*a*, U3*b*, operational amplifier U6*b*, and counters U7*a*, U7*b*. FIG. 9 includes resistor R32, capacitors C21, C22, microcontroller U9, and voltage regulator U11 beyond the circuit of FIG. 7.

Certain elements of FIG. 9 have identical functions to elements of FIG. 7. For example pin 3 of U9 performs the same function as that of pin 1 of transistor Q5 of FIG. 7. Pin 5 of U9 performs the same function as that of CP0*a* clock input of counter 80 of FIG. 7. Pin 6 of U9 performs the same function of pin 1 of transistor Q2 of FIG. 7. Pin 7 of U9 performs the same function as the output pin 5 of timer U$_{3a}$(Oscillator 90) of FIG. 7.

Micro-controller U9 performs the same functions of monostable multivibrator 76, counter 74, oscillator 90, counter 80, resetting square wave generator 98, signal inverter 108 and transistors Q2 and Q5 of FIG. 7. Pin 7 of micro-controller U9 outputs either modulated oscillating signals identically to oscillator 90, or encoded digital pulse signals to drive infrared emitter D5 through resistors R8 and R10. When micro-controller U9 is set to output an encoded digital pulse signal to drive infrared emitter 92, micro-controller U9 will be programmed to identify the encoded digital pulse signal for proximity operation function. Using encoded pulse signals for proximity operation will improve the noise rejection ability of the switch 10.

Pin 5 of micro-controller U9 receives signals from pin 7 of op-amp U6*a* (Schmitt trigger 102). Micro-controller U9 then analyzes the received signals by implementing the same functions of counter 80, monostable multivibrator 76, resetting square wave generator 78 (98 and 108) and counter 74. Micro-controller U9 is also programmed to identify the encoded pulse signals when generating the encoded pulse signal at its pin 7. If the received signal is a valid signal, micro-controller U9 will output corresponding control signals at both pin 3 and 6 to drive on/off controls 72 and 73 on or off in four possible combinations, depending on the number of times an object is moved in front of the infrared emitter or an infrared signal is generated by a remote control unit and received by the infrared receiver. The on/off controls 72 and 73 can be both off, both on, or one on and the other off as previously described with respect to controlling the fixture 32 with changing intensity levels and off. The function of resetting square wave generator 78 is implemented internally in micro-controller U9, again the resetting square wave can be set to different values of frequency and duty cycle ratio.

Micro-controller U9 can learn input signals at input pin 5 and memorize the pattern of the input signal as the only valid control signal. Micro-controller U9 analyzes the input signal at pin 5 and erases the memorized pattern to bring the apparatus back to normal operation. Micro-controller U9 can implement the function of oscillator 90 and also output an encoded digital signal at pin 7 to drive infrared emitter 92 to further improve the noise immunity of the switch 10.

DC voltage regulator U11 provides power at pin 3 for micro-controller U9, op-amp U6a and optical isolators U2 and U10. Capacitor C22 is a bypass capacitor. Resistor R32 and capacitor C21 determine the clock frequency when using external RC oscillator for micro-controller U9. Resistor R32 and capacitor C21 can be eliminated when micro-controller U9 is using an internal RC oscillator.

FIG. 10 illustrates an alternate embodiment for the micro-controller implementation of FIG. 9. The circuit in FIG. 10 performs all fuinctions as described in FIG. 9 with the addition of a timer function. Pin 7 of micro-controller U9 in FIG. 10 outputs series modulated pulses with a carrier frequency ranging between 30 kHz to 80 kHz, preferably 39 kHz, to drive infrared emitter D5. Signal processing IC U12 is similar to U5 in FIG. 7 and 9, and its peripheral components, i.e. capacitors C14, C10, C11 and C13 and resistors R15, R16 and R19 and perform the same functions as described for filter 86, amplifier 84 and signal processor 82 of FIG. 5. Infrared receiver D7 works like Q3 of FIGS. 7 and 9, converting the received infrared signal into an electrical signal and passes it onto input pin 8 of signal processing IC U12 which filers, amplifies and shapes the received signal, outputting a corresponding TTL signal at pin 2 to the input pin 5 of micro-controller U9. Micro-controller U9 of FIG. 10 use its internal oscillator to generate a clock signal thus freeing pin 2 for timer control use. The remaining functions are similar to those described with reference to FIGS. 7 and 9. Switch SW2 is added in FIG. 10 to perform the function of timer control. Resistor R37 and LED D8 are for indication purposes.

The function of timer control can be set to automatically turn on or off the fixture 32 when the switch 10 is in auto mode. To enter into timer control mode, press and hold switch SW2 for about two seconds and release it when user sees LED diode D8 glowing. To set delay time, momentarily pressing switch SW2 once again will set the timer to delay one hour or one unit of a preset time period. Momentarily pressing switch SW2 twice will set the timer to delay two hours or two units of a preset time period. Momentarily pressing switch SW2 N times will set the timer to delay N hours or N units of a preset time period. Once the delay time is set, micro-controller U9 memorizes the delay time setting and starts to count the time. At the same time, LED D8 will start a blinking cycle to indicate the number of hours to be delayed. The LED D8 blinks once a second for N times then stays on for about ten seconds and repeats blinking once a second for N times then stays on for about ten seconds. When micro-controller U9 counts to the end of the set delay time it will output a signal to change the current status of fixture 32 either from on to off or off to on, i.e. if fixture 32 is on, it will be turned off when micro-controller U9 counts to the end of the set delay time and if fixture 32 is off, it will be turned on when micro-controller U9 counts to the end of the set delay time. After the fixture 32 changes its status, either caused by timer control, moving an object in front of the infrared emitter or receipt of an infrared signal by the infrared receiver, the timer control will be disabled and LED D8 is turned off. The next time a user wants to use the function of timer control, switch SW2 is pressed and held for about two seconds and then released when LED D8 is glowing to place the switch 10 in timer control mode. If a user wants to use the previous delay time setting, there is no need to set the delay time again as micro-controller U9 already memorized the previous delay time setting. The user can set a new delay time by performing the steps set out above.

Resistor R37 limits the current flowing through LED D8. LED D8 is for displaying or indicating timer control purpose. Switch SW2 is used to place switch 10 in timer control mode. The remaining components in FIG. 10 have the same function as described above with respect to FIGS. 7 and 9.

Figure 6B:
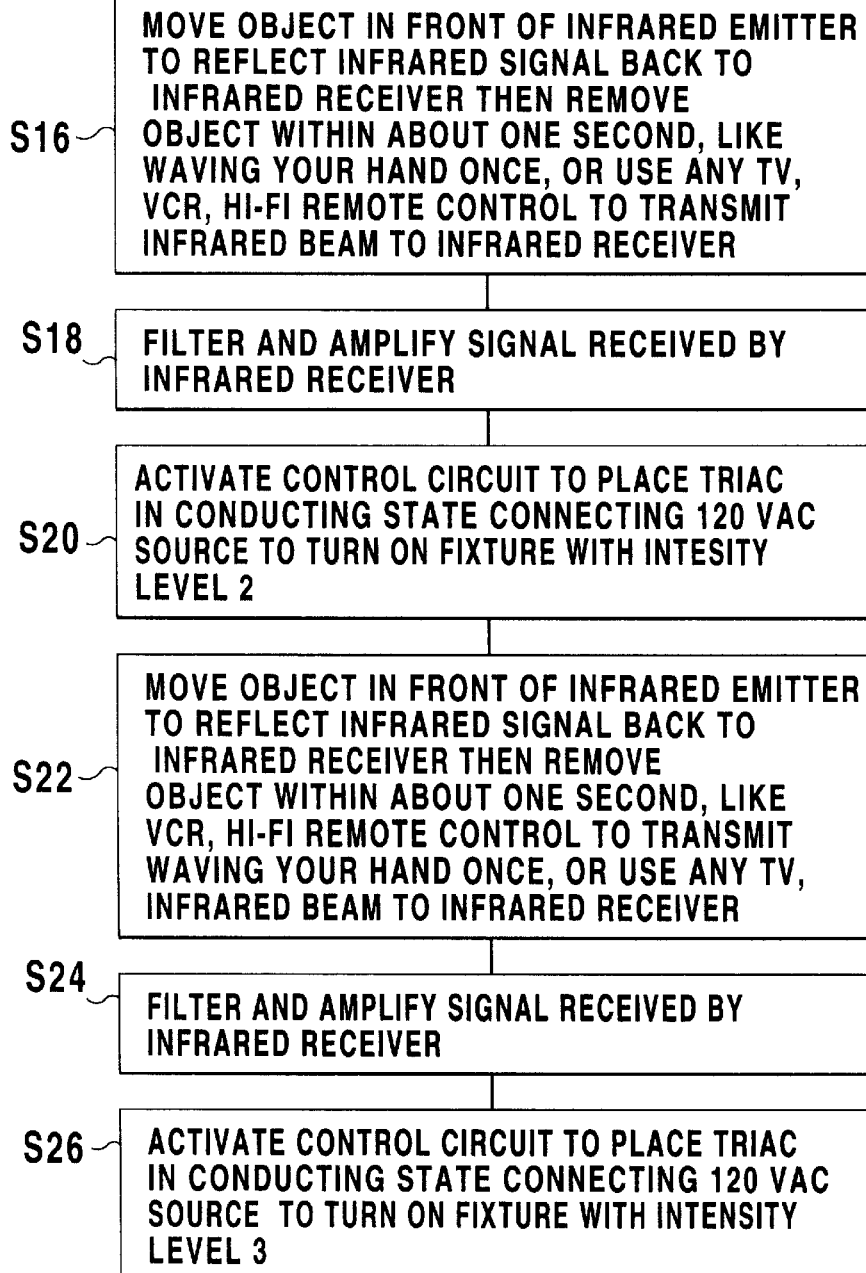
Figure 6C:
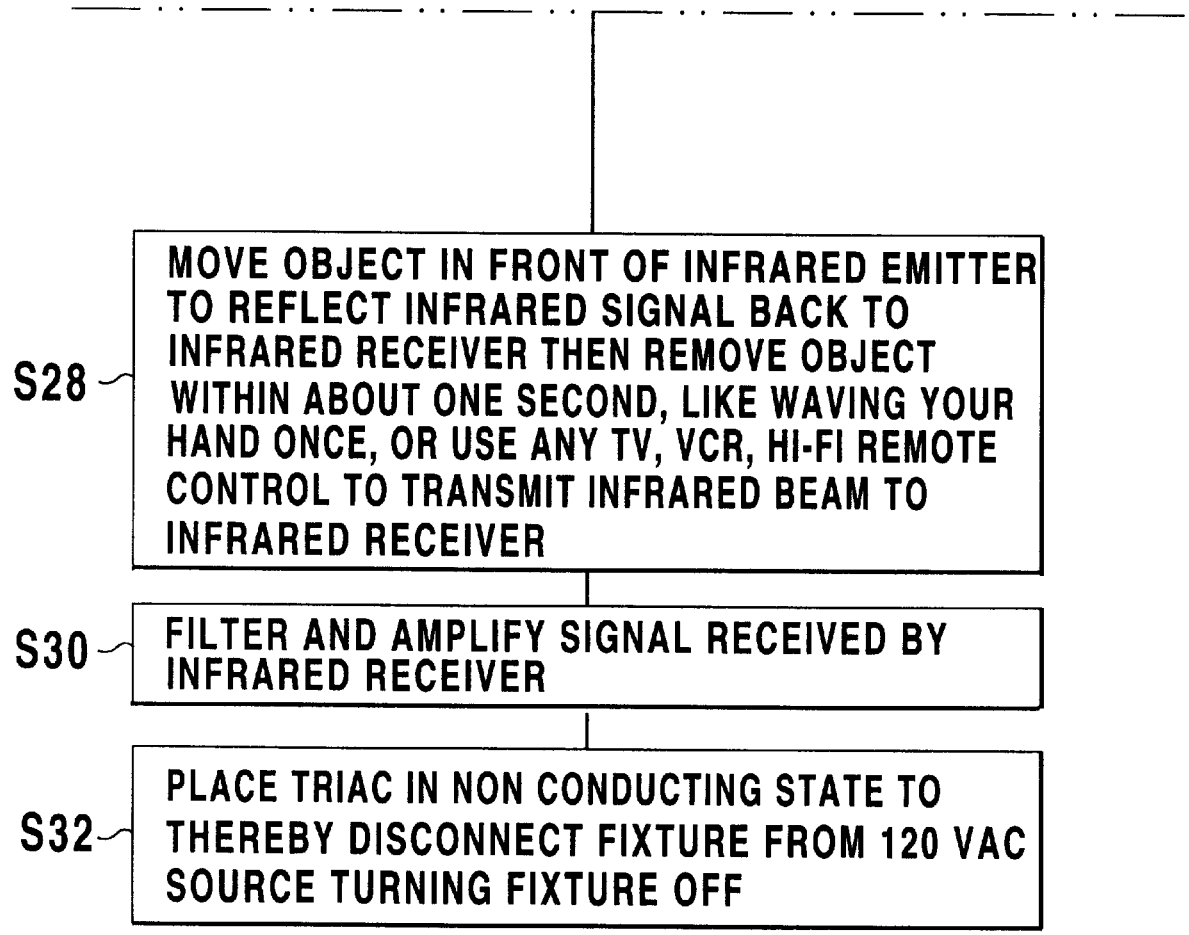
Figure 7A:
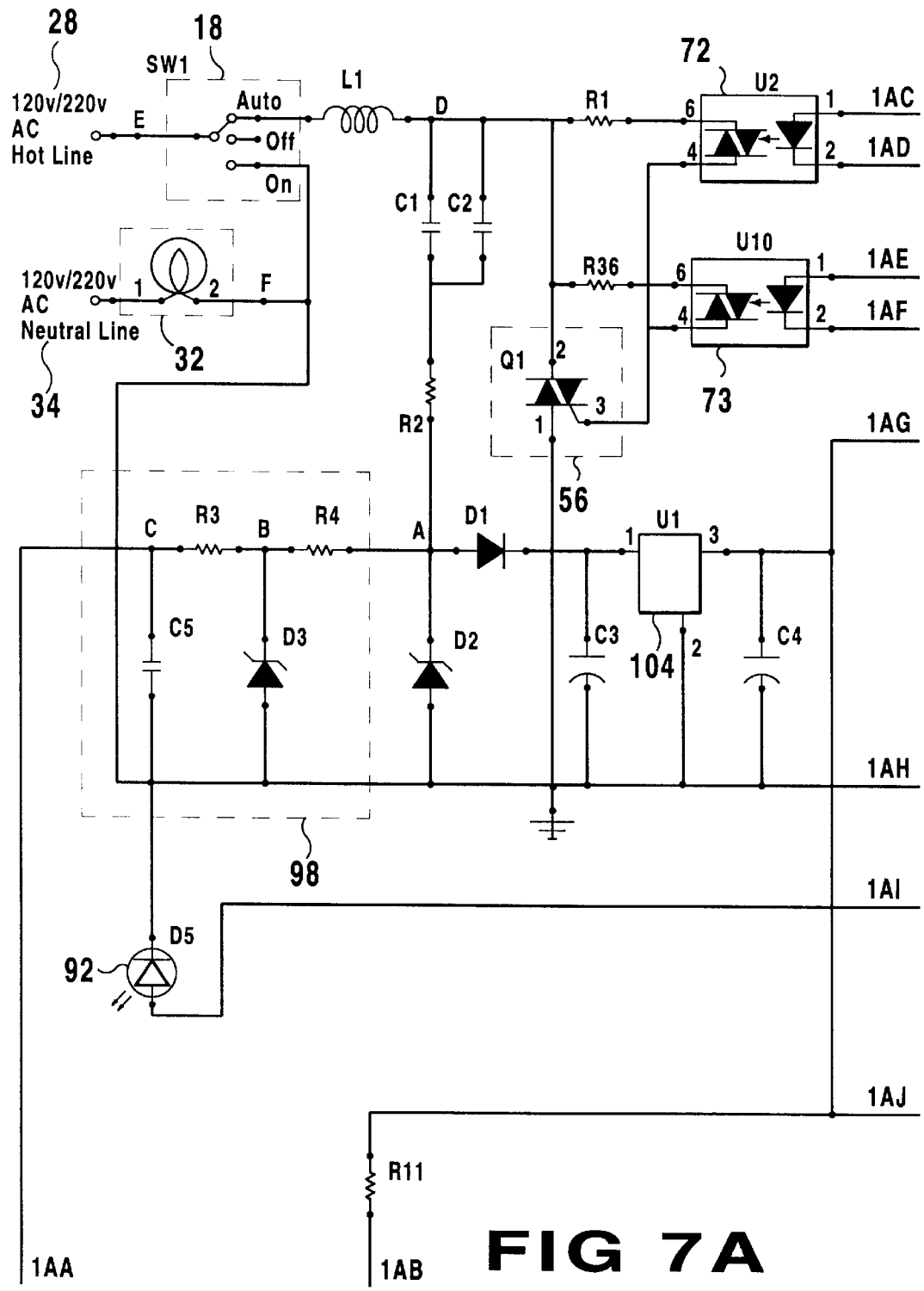
Figure 7B:
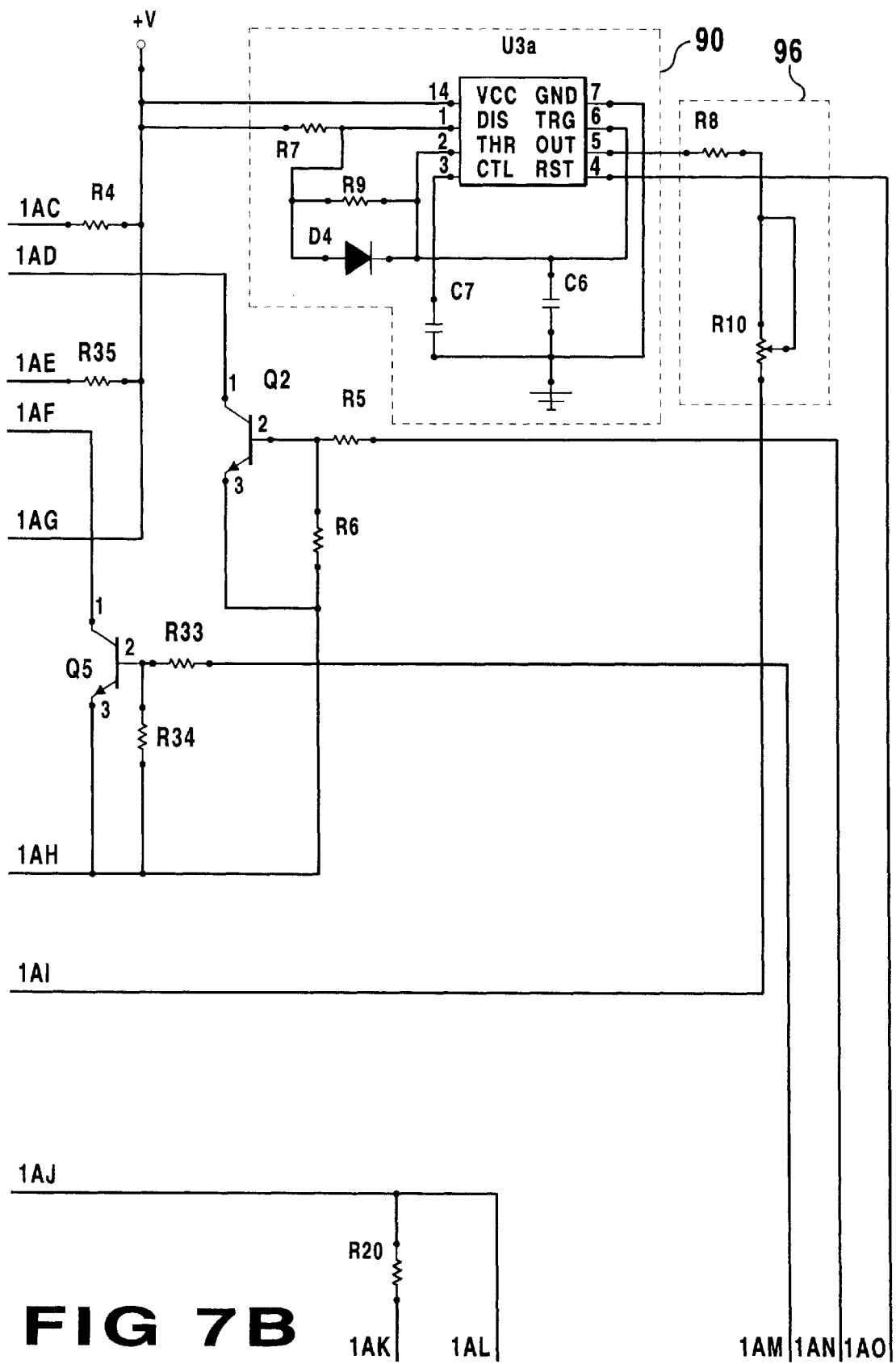
Figure 7C:
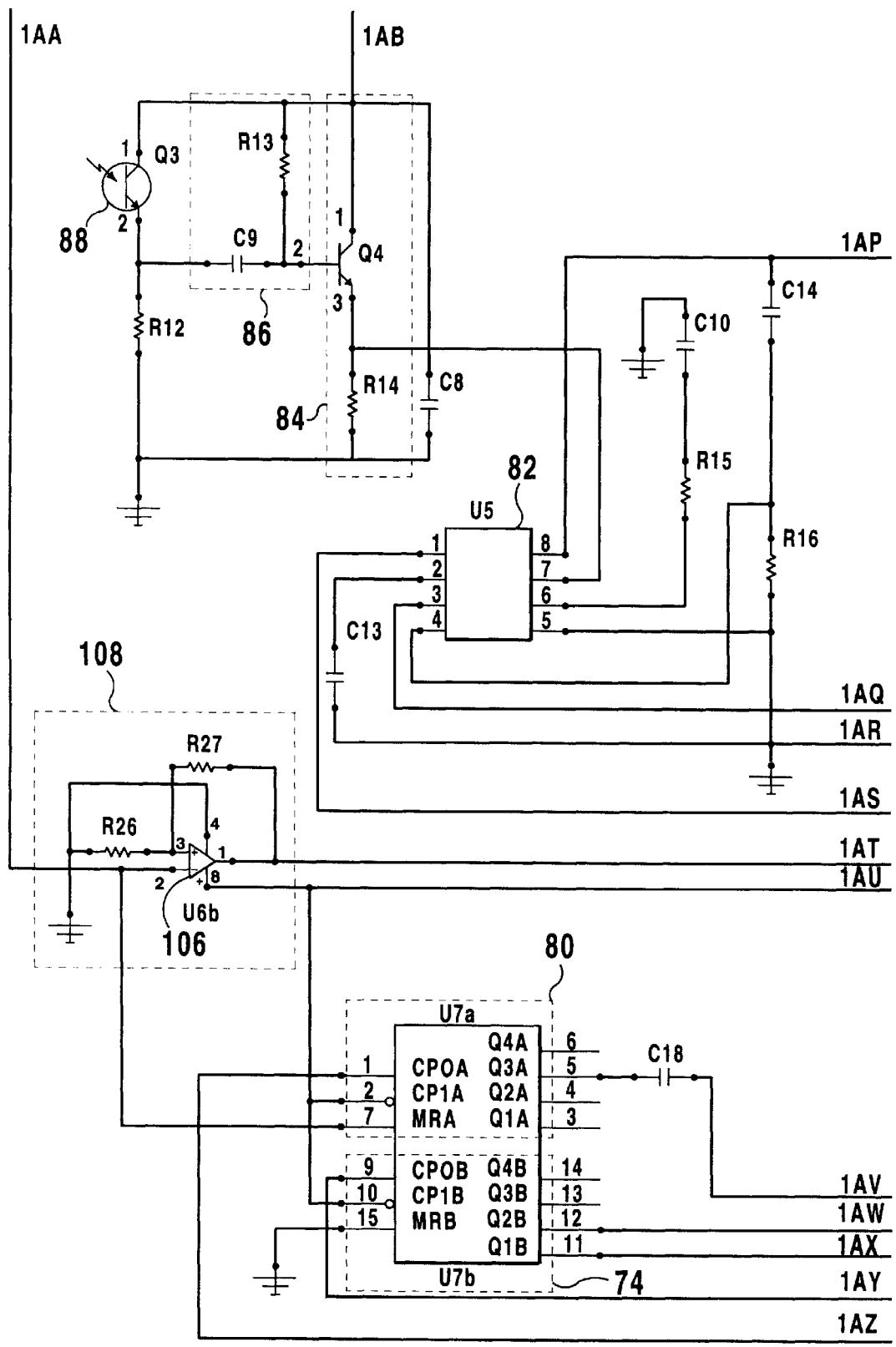
Figure 7D:
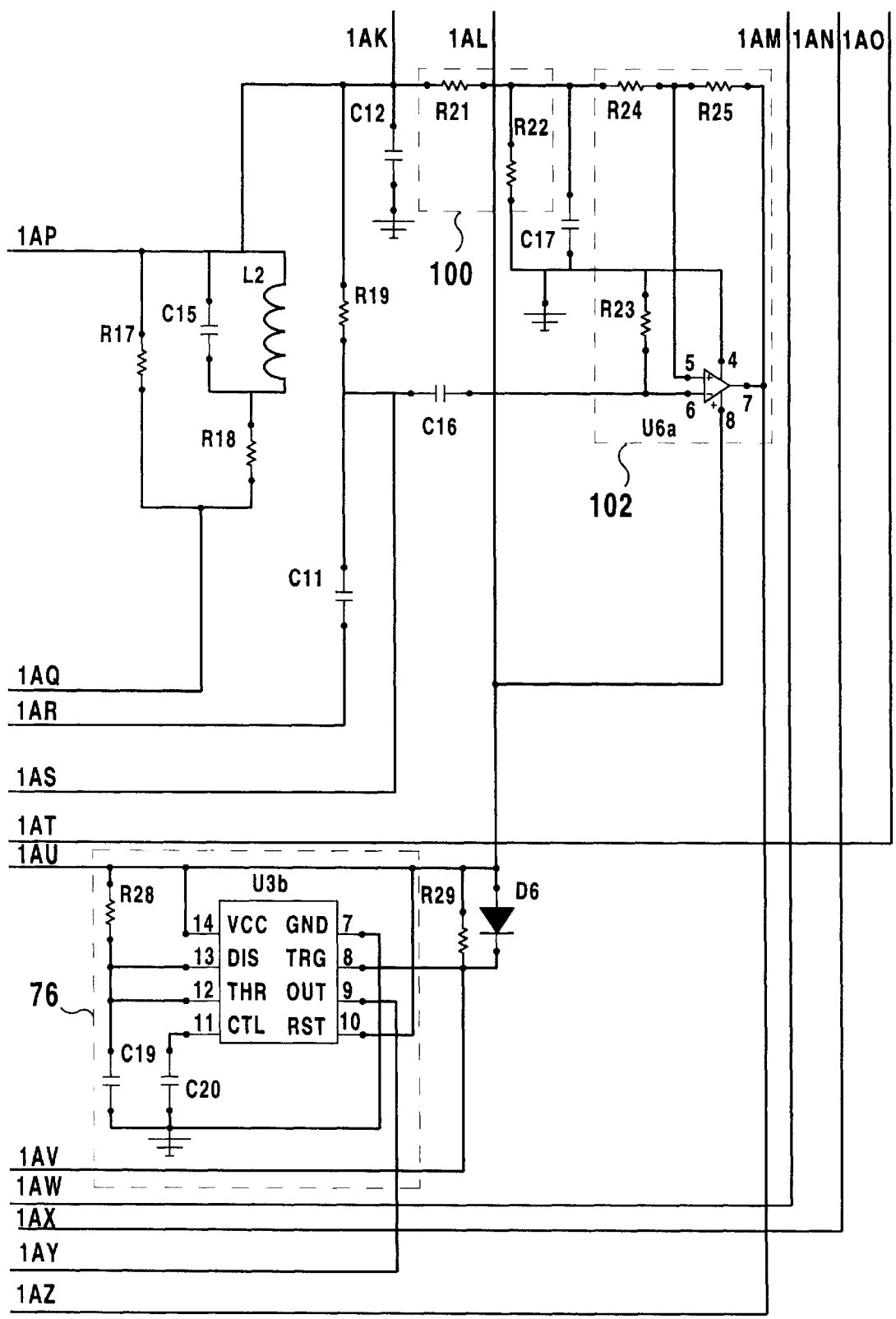

The operation of the infrared proximity and remote control wall switch 10 will now be described with reference to the figures and specifically to FIG. 6. In operation, the infrared proximity and remote control wall switch 10 is connected to a 120 volt AC source line and one end of the fixture to replace a conventional standard wall switch as described in step S2. The other end of the fixture is connected to the neutral line. To turn the fixture 32 off, the switch 18 is placed in the off position 20 as stated in step S4. To turn the fixture 32 on, the switch 18 is placed in the on position 19, by passing the infrared proximity and remote control wall switch 10 of the present invention as stated in step S6. The infrared proximity and remote control wall switch 10 is activated by placing the switch 18 in the auto position 21 as stated in step S8.

When in the auto position 21, an infrared signal is emitted from an infrared emitter 92 within the infrared proximity and remote control wall switch 10. An object 64 is then moved in front of the infrared emitter for approximately one second so as to reflect the infrared signal to the infrared receiver 88 or a conventional remote directs a signal towards the infrared receiver 88 as discussed in step S10. The signal received by the infrared receiver 88 is then filtered and amplified as described in step S12. A control circuit is then activated by the filtered and amplified signal to place a triac switch 56 in a conducting state and connect the 120 volt AC source to turn on the fixture 32 at a first intensity level as stated in step S14.

An object 64 is then moved in front of the infrared emitter for approximately one second so as to reflect the infrared signal to the infrared receiver 88 or a conventional remote directs a signal towards the infrared receiver 88 a second time as discussed in step S16. The second signal received by the infrared receiver 88 is then filtered and amplified as described in step S18. The control circuit is then activated by the filtered and amplified signal to place a triac switch 56 in a conducting state and connect the 120 volt AC source to turn on the fixture 32 at a second intensity level as stated in step S20.

An object 64 is then moved in front of the infrared emitter for approximately one second so as to reflect the infrared signal to the infrared receiver 88 or a conventional remote directs a signal towards the infrared receiver 88 a third time as discussed in step S22. The third signal received by the infrared receiver 88 is then filtered and amplified as described in step S24. The control circuit is then activated by the filtered and amplified signal to place a triac switch 56 in a conducting state and connect the 120 volt AC source to turn on the fixture 32 at a third intensity level as stated in step S26.

An object 64 is then moved in front of the infrared emitter for approximately one second so as to reflect the infrared signal to the infrared receiver 88 or a conventional remote directs a signal towards the infrared receiver 88 a fourth time as discussed in step S28. The fourth signal received by the infrared receiver 88 is then filtered and amplified as described in step S30. The control circuit is then activated by the filtered and amplified signal to place a triac switch 56 in a nonconducting state and disconnects the 120 volt AC source to turn the fixture 32 off as stated in step S32.

From the above description it can be seen that the infrared proximity and remote control wall switch of the present invention is able to overcome the shortcomings of prior art devices by providing an infrared proximity and remote control wall switch which is able to distinguish between short distance (under 1.5 ft.) proximate non-touching control and long distance (up to 25 ft. away) remote control without any intervention while also solving the problem of noise interference from AC line frequency and momentary high frequency noise from other appliances thus providing high sensitivity to control signals and high immunity to noise. The infrared proximity and remote control wall switch is able to be used in public places, such as rest rooms, hospitals, or food processing units, to prevent germs transfer by providing a great convenience due to the hands off and remote control activation and can be operated at either close range or from a large distance without touching the switch itself using one infrared emitter and infrared receiver pair. Activation of the fixture to either turn on or off at close range is accomplished by waving an object in front of the switch and at far range by pressing any button on a conventional remote control of TV, VCR, or other home entertainment unit at up to twenty five feet from the switch when the remote control is pointed directly at the switch. Particular buttons on a conventional remote control may also be associated with particular functions for controlling the switch such as turning the fixture on, turning the fixture off or controlling the intensity at which the fixture is illuminated whereby the fixture may be activated to turn the fixture on at different intensity levels. The infrared proximity and remote control wall switch is also easily installed to replace a conventional electrical switch and uses encoded infrared emitting signals for controlling the allowable proximity of an object for activating the switch and further improve noise immunity of the switch. Furthermore, the infrared proximity and remote control wall switch of the present invention is simple and easy to use and economical in cost to manufacture.

It will be understood that each of the elements described above, or two or more together may also find a useful application in other types of methods differing from the type described above.

While certain novel features of this invention have been shown and described and are pointed out in the annexed claims, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. An infrared proximity and remote control wall switch positioned between a fixture and a voltage source for allowing a fixture to operate in one of a manual and automatic mode, said infrared proximity and remote control wall switch comprising:
    a) a three position switch operable between a first on position connecting the fixture directly to the voltage source, a second off position for disconnecting the fixture from the voltage source and a third auto position for allowing automatic operation of the fixture;
    b) an infrared emitter for generating an infrared signal;
    c) an infrared receiver for receiving one of the infrared signal generated by the infrared emitter reflected by an object and an infrared signal generated by a remote control unit;
    d) means connected to said infrared receiver for filtering said signal received by said infrared receiver to eliminate noise signals therefrom, said means for filtering further including a counter and means for generating a reset signal to determine whether the received signal from said infrared receiver meets the minimum limitation of counts, a trigger signal being generated by said counter only when said received signal meets the minimum limitation of counts, and wherein said counter is periodically reset by said reset signal; and
    e) means connected to said means for filtering for connecting the fixture to the voltage source upon receipt of said trigger signal from said means for filtering.

2. The infrared proximity and remote control wall switch as recited in claim 1, wherein said means for filtering includes means for amplifying said signal received by said infrared receiver.

3. The infrared proximity and remote control wall switch as recited in claim 1, wherein said means for connecting includes a triac switch activated to conduct by said means for filtering upon receipt of said one of the infrared signal generated by the infrared emitter reflected by an object and an infrared signal generated by a remote control unit received by said infrared receiver.

4. The infrared proximity and remote control wall switch as recited in claim 1, wherein said reset signal is a rectangular wave signal, said counter being active to count during a predetermined cycle of said rectangular wave signal.

5. The infrared proximity and remote control wall switch as recited in claim 4, wherein a period of said reset signal is set by a user of said switch.

6. The infrared proximity and remote control wall switch as recited in claim 1, wherein said means for connecting turns the fixture on at a plurality of intensity levels.

7. The infrared proximity and remote control wall switch as recited in claim 6, wherein said means for connecting includes first and second control circuits for selecting one of said plurality of intensity levels at which the fixture is to be turned on.

8. The infrared proximity and remote control wall switch as recited in claim 6, further comprising a second counter for controlling the intensity level at which the fixture turns on.

9. The infrared proximity and remote control wall switch as recited in claim 1, wherein remote control unit generating an infrared signal is at least one of a conventional television, video cassette recorder and hi-fidelity stereo remote control unit.

10. The infrared proximity and remote control wall switch as recited in claim 9, wherein the remote control unit includes a plurality of buttons for generating the infrared signal, wherein activation of any of said plurality of buttons generates an infrared signal able to be received by said infrared receiver for connecting the fixture to the voltage source.

11. The infrared proximity and remote control wall switch as recited in claim 9, further comprising a microcontroller and the remote control unit includes a plurality of buttons for generating the infrared signal, wherein said microcontroller is programmable to memorize activation of a particular one of the plurality of buttons for connecting the fixture to the voltage source.

12. The infrared proximity and remote control wall switch as recited in claim 11, wherein said microcontroller is reprogrammable to delete the particular one of the plurality of buttons therefrom.

13. The infrared proximity and remote control wall switch as recited in claim 1, wherein receiving one of the infrared signal generated by the infrared emitter and reflected by an object and an infrared signal generated by a remote control unit a first time by said infrared receiver causes said means for controlling to turn the fixture on at a first intensity.

14. The infrared proximity and remote control wall switch as recited in claim 13, wherein receiving one of the infrared signal generated by the infrared emitter and reflected by an object and an infrared signal generated by a remote control unit a second time by said infrared receiver causes said means for controlling to turn the fixture on at a second intensity.

15. The infrared proximity and remote control wall switch as recited in claim 14, wherein receiving one of the infrared signal generated by the infrared emitter and reflected by an object and an infrared signal generated by a remote control unit a third time by said infrared receiver causes said means for controlling to turn the fixture on at a third intensity.

16. The infrared proximity and remote control wall switch as recited in claim 15, wherein receiving one of the infrared signal generated by the infrared emitter and reflected by an object and an infrared signal generated by a remote control unit a fourth time by said infrared receiver causes said means for controlling to turn the fixture off.

17. The infrared proximity and remote control wall switch as recited in claim 15, wherein said means for filtering includes a micro-controller for filtering said infrared signal, eliminating noise accompanying said infrared signal and reshaping said signal to trigger said means for connecting.

18. The infrared proximity and remote control wall switch as recited in claim 17, further comprising a timer connected to said means for connecting for controlling said means for connecting to connect the fixture to the voltage source at a predetermined time and disconnect the fixture from the voltage source after a predetermined period of time when said three position switch is in said auto position.

* * * * *